United States Patent
Yamazaki et al.

(10) Patent No.: US 9,577,106 B2
(45) Date of Patent: Feb. 21, 2017

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Toshinari Sasaki, Shinagawa (JP); Takashi Hamochi, Shimotsuga (JP); Toshiyuki Miyamoto, Kanuma (JP); Masafumi Nomura, Tochigi (JP); Junichi Koezuka, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 253 days.

(21) Appl. No.: 13/922,693

(22) Filed: Jun. 20, 2013

(65) Prior Publication Data

US 2014/0001467 A1 Jan. 2, 2014

(30) Foreign Application Priority Data

Jun. 29, 2012 (JP) ................................. 2012-147783

(51) Int. Cl.
*H01L 29/12* (2006.01)
*H01L 29/786* (2006.01)

(52) U.S. Cl.
CPC ................. *H01L 29/7869* (2013.01)

(58) Field of Classification Search
CPC .................. H01L 27/1225; H01L 29/7869
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 001405898 3/2003
CN 001458694 A 11/2003
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Kenneth Parker
*Assistant Examiner* — John Lin
(74) *Attorney, Agent, or Firm* — Robinson Intellectual Property Law Office; Eric J. Robinson

(57) ABSTRACT

To provide a semiconductor device including an oxide semiconductor in which a change in electrical characteristics is suppressed or whose reliability is improved. In a semiconductor device including an oxide semiconductor film in which a channel formation region is formed, an insulating film which suppresses entry of water and contains at least nitrogen and an insulating film which suppresses entry of nitrogen released form the insulating film are provided over the oxide semiconductor film. As water entering the oxide semiconductor film, water contained in the air, water in a film provided over the insulating film which suppresses entry of water, or the like can be given. Further, as the insulating film which suppresses entry of water, a nitride insulating film can be used, and the amount of hydrogen molecules released by heating from the nitride insulating film is smaller than $5.0 \times 10^{21}$ molecules/cm$^3$.

15 Claims, 21 Drawing Sheets

(58) Field of Classification Search
USPC .............................. 257/43, E29.296; 438/104
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,838,397 | B2 | 1/2005 | Takayama et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,335,918 | B2 | 2/2008 | Takayama et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,642,559 | B2 | 1/2010 | Yamazaki et al. |
| 7,674,650 | B2 | 3/2010 | Akimoto et al. |
| 7,732,819 | B2 | 6/2010 | Akimoto et al. |
| 7,825,588 | B2 | 11/2010 | Yamazaki et al. |
| 7,893,439 | B2 | 2/2011 | Takayama et al. |
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,399,274 | B2 | 3/2013 | Kang et al. |
| 8,466,463 | B2 | 6/2013 | Akimoto et al. |
| 8,502,217 | B2 | 8/2013 | Sato et al. |
| 8,519,387 | B2 | 8/2013 | Endo et al. |
| 8,866,144 | B2 | 10/2014 | Takayama et al. |
| 8,936,963 | B2 | 1/2015 | Ohara et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0047785 | A1 | 3/2003 | Kawasaki et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0290393 | A1 | 11/2008 | Kakehata et al. |
| 2008/0296568 | A1 | 12/2008 | Ryu et al. |
| 2009/0008724 | A1 | 1/2009 | Mishima et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0325341 | A1 | 12/2009 | Itagaki et al. |
| 2010/0032667 | A1* | 2/2010 | Yamazaki et al. .............. 257/43 |
| 2010/0051937 | A1 | 3/2010 | Kaji et al. |
| 2010/0051940 | A1* | 3/2010 | Yamazaki ........... H01L 29/4908 257/43 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0233848 | A1 | 9/2010 | Ohara et al. |
| 2010/0283049 | A1 | 11/2010 | Sato et al. |
| 2011/0079778 | A1 | 4/2011 | Yamazaki et al. |
| 2011/0101335 | A1 | 5/2011 | Yamazaki et al. |
| 2011/0140205 | A1 | 6/2011 | Sakata et al. |
| 2011/0151618 | A1 | 6/2011 | Yamazaki et al. |
| 2011/0175674 | A1 | 7/2011 | Shimizu et al. |
| 2011/0269266 | A1 | 11/2011 | Yamazaki |
| 2011/0287580 | A1 | 11/2011 | Yamazaki et al. |
| 2011/0303914 | A1 | 12/2011 | Yamazaki |
| 2011/0309456 | A1 | 12/2011 | Yamazaki |
| 2012/0001170 | A1 | 1/2012 | Yamazaki |
| 2012/0112045 | A1 | 5/2012 | Tsubuku et al. |
| 2012/0241736 | A1 | 9/2012 | Imoto et al. |
| 2012/0241738 | A1 | 9/2012 | Imoto et al. |
| 2012/0298998 | A1 | 11/2012 | Yamazaki et al. |
| 2012/0312681 | A1 | 12/2012 | Yamazaki et al. |
| 2014/0001466 | A1 | 1/2014 | Sasaki et al. |
| 2015/0035058 | A1 | 2/2015 | Takayama et al. |

FOREIGN PATENT DOCUMENTS

| | | |
|---|---|---|
| CN | 101884109 | 11/2010 |
| CN | 101894759 A | 11/2010 |
| CN | 102184965 | 9/2011 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073562 A | 3/2007 |
| JP | 2007-096055 A | 4/2007 |
| JP | 2007-123861 A | 5/2007 |
| JP | 2009-141002 A | 6/2009 |
| JP | 2009-224479 A | 10/2009 |
| JP | 2011-146574 A | 7/2011 |
| JP | 2011-146697 A | 7/2011 |
| JP | 2012-004554 A | 1/2012 |
| JP | 2012-023359 A | 2/2012 |
| JP | 2012-028481 A | 2/2012 |
| JP | 2012-114428 A | 6/2012 |
| KR | 2003-0022692 A | 3/2003 |
| KR | 2012-0048514 A | 5/2012 |
| TW | 552718 | 9/2003 |
| TW | 201117371 | 5/2011 |
| TW | 201212234 | 3/2012 |
| WO | WO-2004/114391 | 12/2004 |
| WO | WO-2009/072532 | 6/2009 |
| WO | WO-2011/074409 | 6/2011 |
| WO | WO-2011/158703 | 12/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Tratment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 277-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composited for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or ZN] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2013/067590) Dated Jul. 30, 2013.

Written Opinion (Application No. PCT/JP2013/067590) Dated Jul. 30, 2013.

Chinese Office Action (Application No. 201380034241.1) Dated Oct. 8, 2016.

Taiwanese Office Action (Application No. 102122702) Dated Nov. 23, 2016.

\* cited by examiner

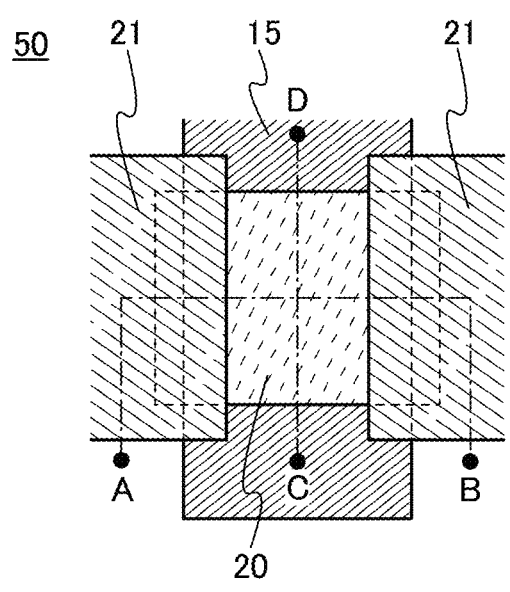
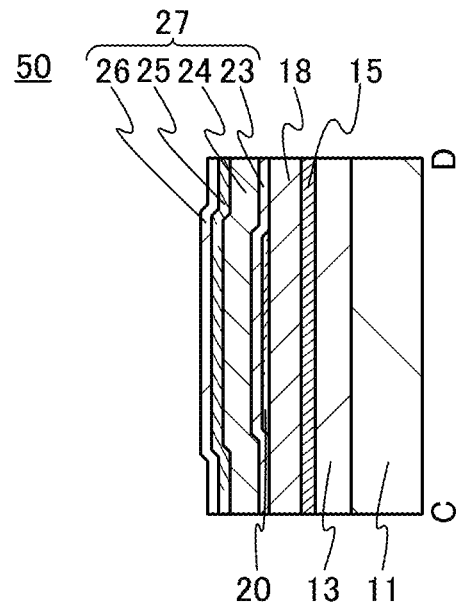
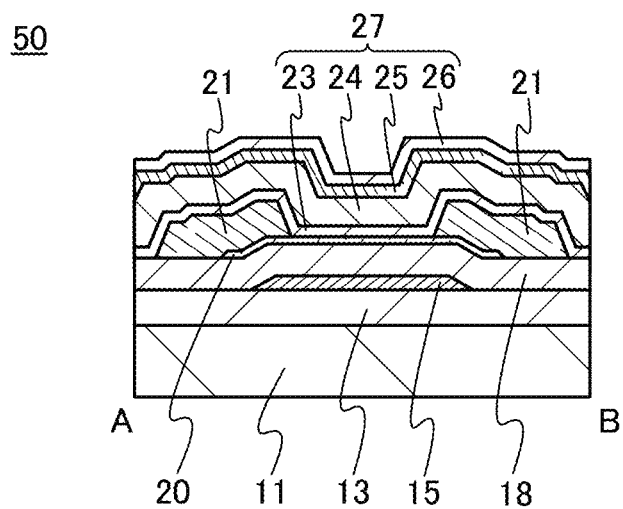

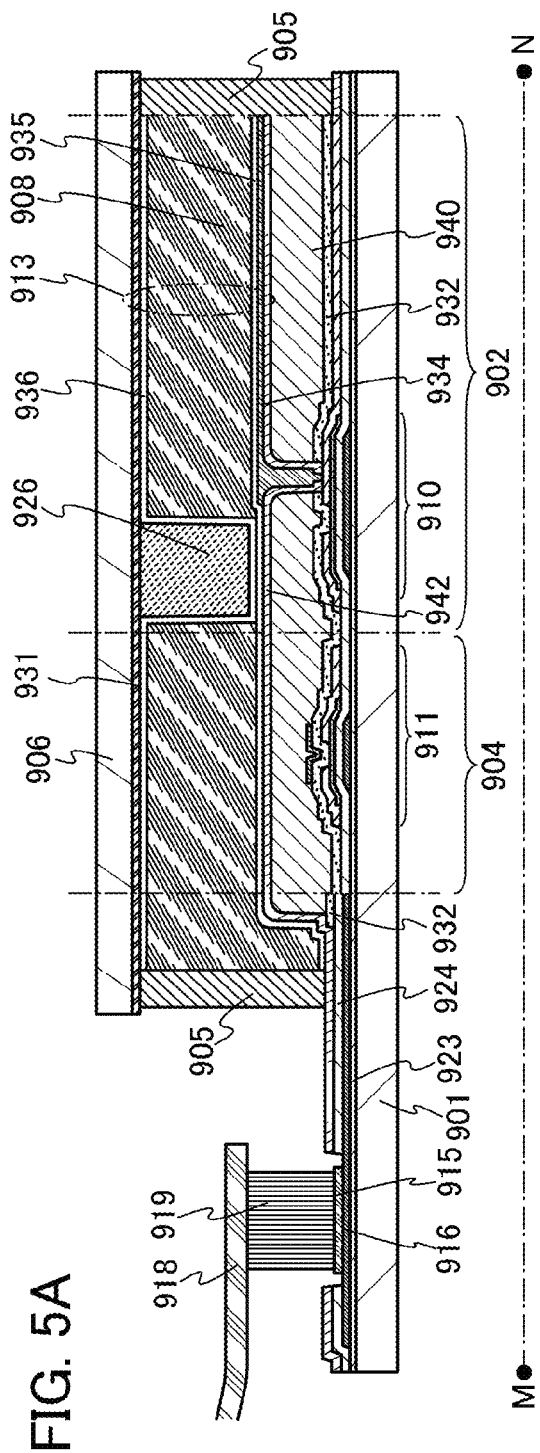

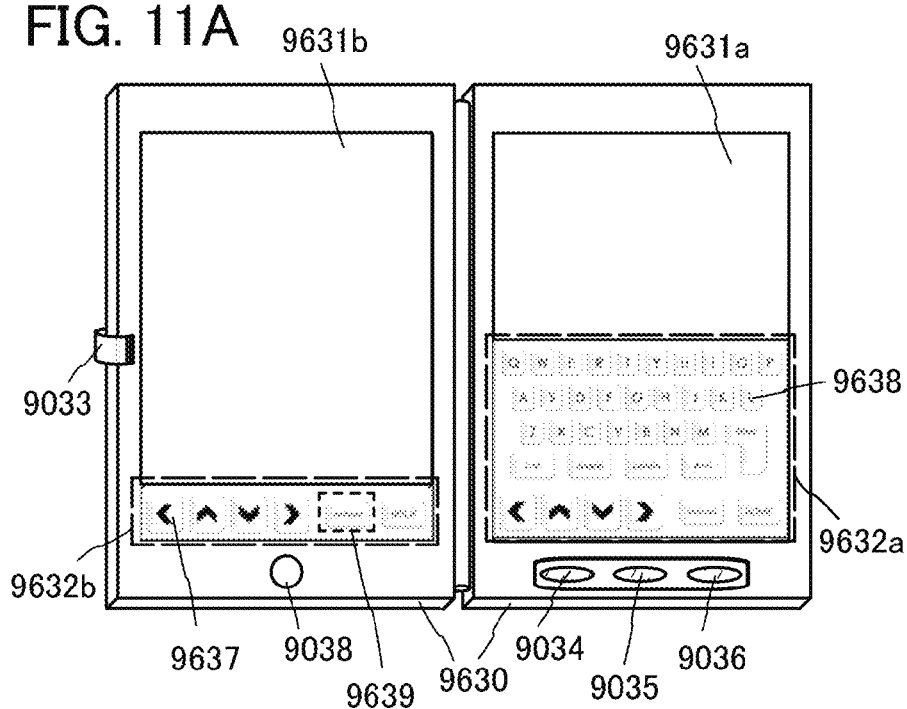
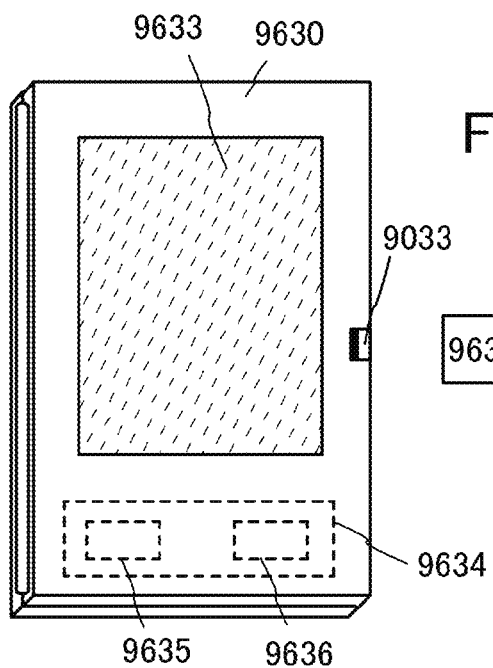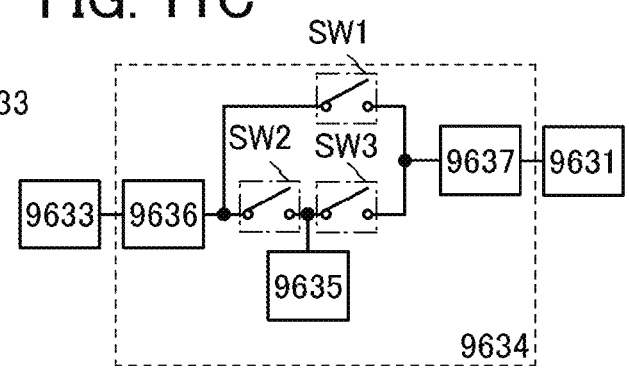

FIG. 16A M/z=32($O_2$)
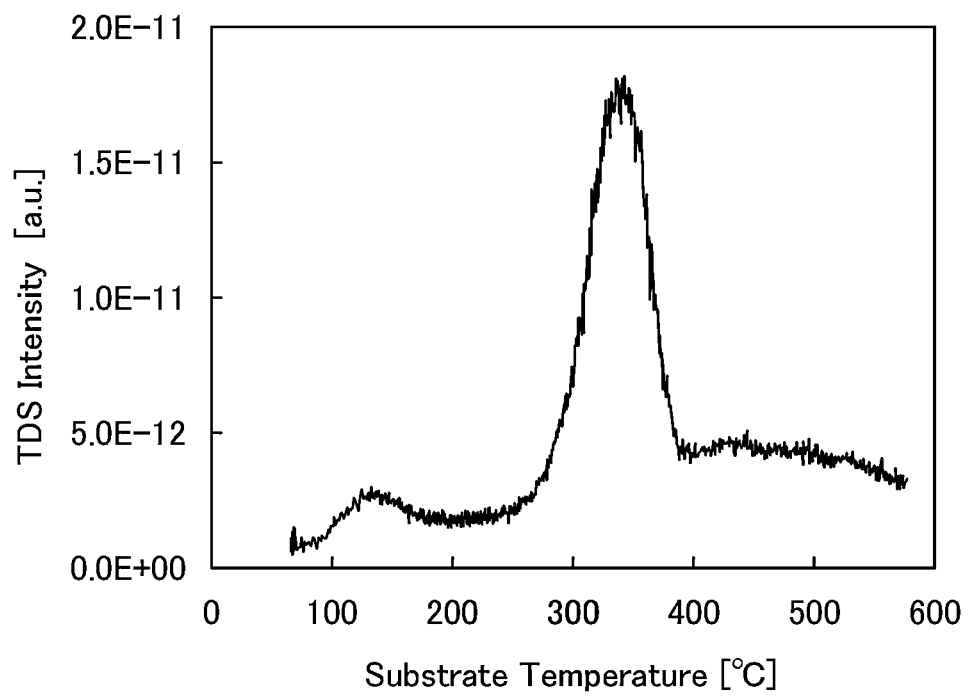
FIG. 16B M/z=18($H_2O$)
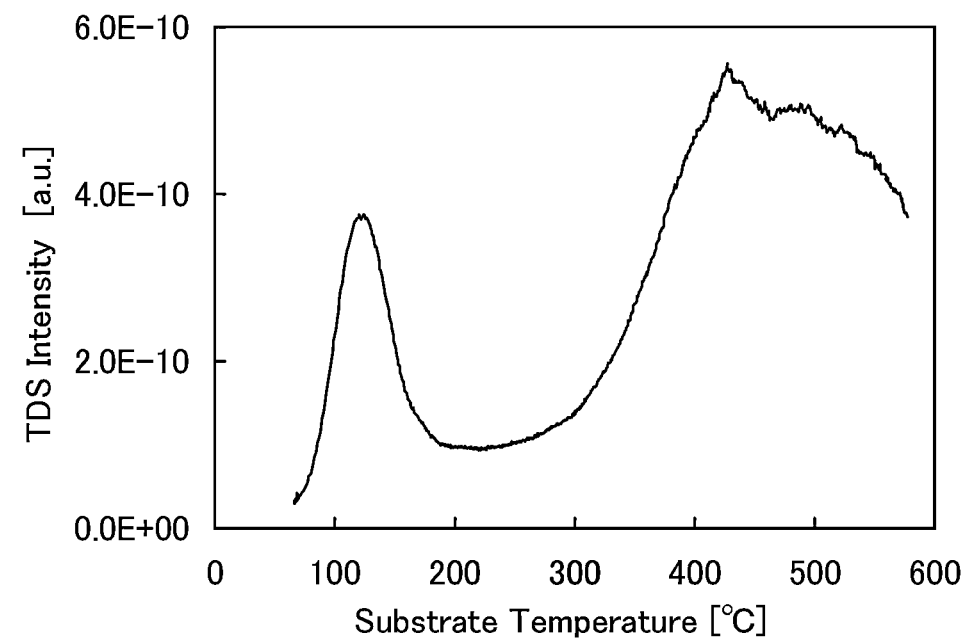

SEMICONDUCTOR DEVICE

TECHNICAL FIELD

The invention disclosed in this specification and the like relates to semiconductor devices.

Note that a semiconductor device in this specification and the like refers to any device that can function by utilizing semiconductor characteristics, and for example, electro-optical devices, image display devices, semiconductor circuits, and electronic devices are all semiconductor devices.

BACKGROUND ART

For an image display device typified by a liquid crystal display device and a light-emitting display device, a transistor using a semiconductor thin film formed over a substrate having an insulating surface is utilized. Further, such a transistor is applied to a wide range of electronic devices such as an integrated circuit (IC). For the semiconductor thin film which can be applied to the transistor, not only a widely known silicon-based semiconductor but also a metal oxide showing semiconductor characteristics (hereinafter referred to as an oxide semiconductor) can be used.

For example, a technique for forming a transistor using zinc oxide or an In—Ga—Zn-based oxide semiconductor as an oxide semiconductor is disclosed (see Patent Documents 1 and 2).

In this specification, a transistor in which an oxide semiconductor thin film is used as a semiconductor thin film formed over a substrate having an insulating surface is referred to as a transistor using an oxide semiconductor. Further, a transistor can function by utilizing semiconductor characteristics; thus, in this specification, a transistor is a semiconductor device.

REFERENCE

Patent Document

[Patent Document 1] Japanese Published Patent Application No. 2007-123861
[Patent Document 2] Japanese Published Patent Application No. 2007-096055

DISCLOSURE OF INVENTION

In a semiconductor device using an oxide semiconductor, elements released from an insulating film or the like provided over an oxide semiconductor film including a channel formation region are diffused into the oxide semiconductor film as impurities, so that electrical characteristics (typically, a threshold voltage) of the semiconductor device are changed, which lowers the reliability of the semiconductor device in some cases.

For example, in the case where water and/or hydrogen, or nitrogen and/or ammonia is contained in the insulating film provided over the oxide semiconductor film, diffusion of any of water, hydrogen, nitrogen, and ammonia causes a change in electrical characteristics of the semiconductor device, which lowers the reliability of the semiconductor device.

Hydrogen which has entered the oxide semiconductor film reacts with oxygen bonded to a metal atom to produce water, and a defect is formed in a lattice from which oxygen is eliminated (or a portion from which oxygen is eliminated). In addition, the reaction of part of hydrogen and oxygen causes generation of electrons serving as carriers. Further, reaction of nitrogen which has entered the oxide semiconductor film with a metal atom or oxygen causes generation of electrons serving as carriers. As a result, the transistor including the oxide semiconductor film containing hydrogen or nitrogen is likely to be normally on.

Thus, an object of one embodiment of the present invention is to provide a semiconductor device including an oxide semiconductor in which a change in electrical characteristics is suppressed or whose reliability is improved.

One embodiment of the present invention is a semiconductor device which includes an oxide semiconductor film including a channel formation region, and includes, over the oxide semiconductor film, an insulating film which contains at least nitrogen and suppresses entry (diffusion) of water and an insulating film which suppresses entry (diffusion) of elements, typically nitrogen, which are released from the insulating film. As water entering the oxide semiconductor film, water contained in the air, water in a film provided over the insulating film which suppresses entry of water, and the like can be given. Further, as a source of nitrogen, $N_2$, $NH_3$, and the like can be given.

That is, a semiconductor device of one embodiment of the present invention includes at least an insulating film which suppresses entry of water and an insulating film which protects an oxide semiconductor film from elements in the insulating film to be released from the insulating film to enter the oxide semiconductor film. The insulating film for protecting the oxide semiconductor film suppresses entry of nitrogen more than entry of hydrogen. Thus, the insulating film which suppresses entry of water is preferably an insulating film in which the hydrogen content is reduced as much as possible. For example, the amount of hydrogen molecules released by heating from the insulating film which suppresses entry of water is preferably smaller than $5.0 \times 10^{21}$ molecules/cm$^3$.

Thus, one embodiment of the present invention is a semiconductor device which includes a gate electrode; a gate insulating film covering the gate electrode; an oxide semiconductor film overlapping with the gate electrode with the gate insulating film provided therebetween; a pair of electrodes in contact with the oxide semiconductor film; a first insulating film provided over the oxide semiconductor film; and a second insulating film which is in contact with the first insulating film and contains at least nitrogen. The first insulating film protects the oxide semiconductor film from nitrogen which is released from the second insulating film and enters the oxide semiconductor film. The amount of hydrogen molecules released by heating from the second insulating film is smaller than $5.0 \times 10^{21}$ molecules/cm$^3$.

Further, in the semiconductor device of one embodiment of the present invention, a dense oxide insulating film can be used as the insulating film which protects the oxide semiconductor film from elements released from the insulating film which suppresses entry of water. As the insulating film which suppresses entry of water, a nitride insulating film can be used, and the amount of hydrogen molecules released by heating from the nitride insulating film is in the above range.

One embodiment of the present invention is a semiconductor device which includes a gate electrode; a gate insulating film covering the gate electrode; an oxide semiconductor film overlapping with the gate electrode with the gate insulating film provided therebetween; a pair of electrodes in contact with the oxide semiconductor film; a first insulating film provided over the oxide semiconductor film; and a second insulating film which is in contact with the first insulating film. The first insulating film is a dense oxide insulating film. The amount of hydrogen molecules released by heating from the second insulating film is smaller than $5.0\times10^{21}$ molecules/cm$^3$.

Further, in the semiconductor device of one embodiment of the present invention, the dense oxide insulating film is an oxide insulating film of which the etching rate with hydrofluoric acid of 0.5 wt % at 25° C. is lower than or equal to 10 nm/min.

One embodiment of the present invention is a semiconductor device which includes a gate electrode; a gate insulating film covering the gate electrode; an oxide semiconductor film overlapping with the gate electrode with the gate insulating film provided therebetween; a pair of electrodes in contact with the oxide semiconductor film; a first insulating film over the oxide semiconductor film; and a second insulating film which is in contact with the first insulating film. The first insulating film is an oxide insulating film of which the etching rate with hydrofluoric acid of 0.5 wt % at 25° C. is smaller than or equal to 10 nm/min. The second insulating film is a nitride insulating film, and the amount of hydrogen molecules released by heating from the nitride insulating film is smaller than $5.0\times10^{21}$ molecules/cm$^3$.

In the semiconductor device, in the case where an organic resin film is provided in contact with the second insulating film and serves as an interlayer insulating film or a planarization insulating film, the second insulating film can suppress diffusion of water contained in the organic resin film and water in the air through the organic resin film into the oxide semiconductor film. As an example of the organic resin film, an acrylic film or the like can be given.

In the semiconductor device of one embodiment of the present invention, an insulating film which can fill oxygen vacancies included in an oxide semiconductor film is provided between the oxide semiconductor film and an insulating film which protects the oxide semiconductor film from elements released from the insulating film which suppresses entry of water. Specifically, an insulating film which is in contact with an oxide semiconductor film and through which oxygen penetrates and an insulating film which is in contact with the insulating film through which oxygen penetrates and which contains oxygen at a higher proportion than a stoichiometric composition are provided.

In the semiconductor device, the insulating film through which oxygen penetrates and the insulating film which contains oxygen at a higher proportion than the stoichiometric composition are provided over the oxide semiconductor film. Thus, the semiconductor device of one embodiment of the present invention includes four kinds of insulating films having different functions over the oxide semiconductor film.

One embodiment of the present invention is a semiconductor device which includes a gate electrode; a gate insulating film covering the gate electrode; an oxide semiconductor film overlapping with the gate electrode with the gate insulating film provided therebetween; a pair of electrodes in contact with the oxide semiconductor film; a first insulating film in contact with the oxide semiconductor film; a second insulating film which is in contact with the first insulating film; a third insulating film which is in contact with the second insulating film; and a fourth insulating film which is in contact with the third insulating film and contains at least nitrogen. The first insulating film is an insulating film through which oxygen penetrates. The second insulating film contains oxygen at a higher proportion than a stoichiometric composition. The third insulating film protects the oxide semiconductor film from nitrogen which is released from the fourth insulating film and enters the oxide semiconductor film. The amount of hydrogen molecules released by heating from the fourth insulating film is smaller than $5.0\times10^{21}$ molecules/cm$^3$.

Further, in the above semiconductor device, an oxide insulating film through which oxygen penetrates can be used as the first insulating film, an oxide insulating film which contains oxygen at a higher proportion than a stoichiometric composition can be used as the second insulating film, a dense oxide insulating film can be used as the third insulating film, a nitride insulating film can be used as the fourth insulating film, and the amount of hydrogen molecules released by heating from the nitride insulating film is in the above range.

In the above semiconductor device, the dense oxide insulating film which can be used as the third insulating film is an oxide insulating film of which the etching rate with hydrofluoric acid of 0.5 wt % at 25° C. is lower than or equal to 10 nm/min, which is lower than the etching rate of the second insulating film.

In the above semiconductor device, in the case where an organic resin film is provided in contact with the fourth insulating film to serve as an interlayer insulating film or a planarization insulating film, the fourth insulating film can suppress diffusion of water contained in the organic resin film and water in the air into the oxide semiconductor film through the organic resin film. For example, as the organic resin film, an acrylic film or the like can be given.

According to one embodiment of the present invention, a semiconductor device in which a change in electrical characteristics is suppressed or a semiconductor device whose reliability is improved can be provided. Note that as the change in electrical characteristics which can be suppressed by the semiconductor device of one embodiment of the present invention, a change in threshold voltage of the semiconductor device over time, a change in threshold voltage of a semiconductor device due to a gate bias-temperature (BT) stress test with light irradiation, or the like can be given.

BRIEF DESCRIPTION OF DRAWINGS

FIGS. 1A to 1C are a top view and cross-sectional views illustrating one embodiment of a transistor.

FIGS. 5A and 5B are cross-sectional views illustrating one embodiment of a display device.

FIGS. 11A to 11C illustrate an electronic device.

FIGS. 16A and 16B show results of thermal desorption spectroscopy.

BEST MODE FOR CARRYING OUT THE INVENTION

Figure 2A:
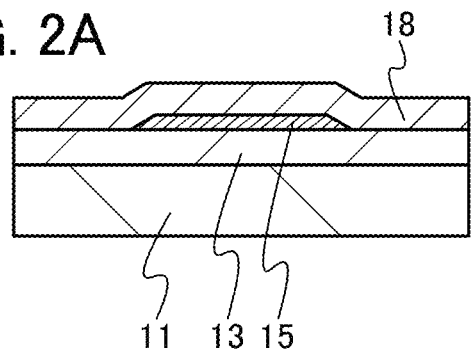
FIGS. 2A to 2D are cross-sectional views illustrating one embodiment of a method for manufacturing a transistor.

Hereinafter, embodiments of the present invention are described in detail with reference to the accompanying drawings. Note that the present invention is not limited to the description below and it is easily understood by those skilled in the art that the mode and details can be changed in various ways. Therefore, the invention should not be construed as being limited to the description in the following embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales. Further, the ordinal numbers such as "first", "second", and the like in this specification and the like are used for convenience and do not denote the order of steps or the stacking order of layers. In addition, the ordinal numbers in this specification do not denote particular names which specify the present invention.

Functions of a "source" and a "drain" in the present invention are sometimes replaced with each other when the direction of a current flowing is changed in circuit operation, for example. Therefore, the terms "source" and "drain" can be interchanged with each other in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography step, a mask formed in the photolithography step is removed after the etching step.

Embodiment 1

In this embodiment, a semiconductor device of one embodiment of the present invention and a method for manufacturing the semiconductor device are described with reference to drawings. In this embodiment, a transistor including an oxide semiconductor film is described as an example of the semiconductor device.

FIGS. 1A to 1C are a top view and cross-sectional views of a transistor 50. FIG. 1A is a top view of the transistor 50, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a base insulating film 13, some components of the transistor 50 (e.g., a gate insulating film 18), insulating films 23 to 26, and the like are omitted for simplicity.

The transistor 50 is a bottom-gate transistor in which a gate electrode 15 is provided over the substrate 11. In the transistor 50, the gate insulating film 18 is provided over the substrate 11 and the gate electrode 15, an oxide semiconductor film 20 is provided to overlap with the gate electrode 15 with the gate insulating film 18 provided therebetween, and a pair of electrodes 21 is provided in contact with the oxide semiconductor film 20. Further, in the transistor 50, at least the insulating films 25 and 26 are provided over the gate insulating film 18, the oxide semiconductor film 20, and the pair of electrodes 21. The transistor 50 preferably includes a protective film 27 which is formed of the insulating films 23 and 24 provided between the insulating film 25 and the oxide semiconductor film 20 and the insulating films 25 and 26 (see FIGS. 1B and 1C).

The insulating film 26 at least contains nitrogen and has a function of suppressing entry of water from the outside into the oxide semiconductor film 20. The insulating film 25 has a function of suppressing entry of elements released from the insulating film 26 into the oxide semiconductor film 20. That is, the insulating film 25 protects the oxide semiconductor film 20 from the elements released from the insulating film 26. Further, the insulating film 25 also has a function of suppressing release of oxygen contained in the oxide semiconductor film 20, a film provided over the oxide semiconductor film 20 (e.g., the insulating films 23 and 24), or the like to the outside (a blocking effect for oxygen). The insulating film 26 may also has a blocking effect for oxygen. The elements released from the insulating film 26 are mainly nitrogen and contain a compound, such as ammonia, which can be a source of nitrogen. In this specification, water in the outside means water contained in the air or water contained in any of the components (e.g., an insulating film) other than the insulating film 26.

As the insulating film 25, a dense oxide insulating film can be applied. Specifically, the dense oxide insulating film is an oxide insulating film of which the etching rate with hydrofluoric acid of 0.5 wt % at 25° C. is lower than or equal to 10 nm/min, preferably lower than or equal to 8 nm/min.

The insulating film 25 has a thickness with which entry of the elements released from the insulating film 26 into the oxide semiconductor film 20 can be suppressed. For example, the thickness of the insulating film 25 can be greater than or equal to 5 nm and less than or equal to 150 nm, preferably greater than or equal to 5 nm and less than or equal to 50 nm, further preferably greater than or equal to 10 nm and less than or equal to 30 nm.

Thus, as the insulating film 25, a silicon oxide film, a silicon oxynitride film, or the like which has the above etching rate and a thickness in the above range can be used.

The silicon oxide film or the silicon oxynitride film which can be used as the insulating film 25 can be formed using the following formation conditions. The substrate placed in a treatment chamber of the plasma CVD apparatus, which is vacuum-evacuated, is held at a temperature higher than or equal to 300° C. and lower than or equal to 400° C., preferably higher than or equal to 320° C. and lower than or equal to 370° C., the pressure is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As a source gas of the insulating film 25, a deposition gas containing silicon and an oxidizing gas is preferably used. Typical examples of the deposition gas containing silicon include silane, disilane, trisilane, and silane fluoride. Examples of the oxidizing gas include oxygen, ozone, dinitrogen monoxide, and nitrogen dioxide.

As the insulating film 26, a nitride insulating film is preferably used, and the amount of hydrogen molecules released by heating from the nitride insulating film is reduced as much as possible. This is because the insulating film 25 strongly suppresses diffusion of nitrogen released from the insulating film 26 but weakly suppresses diffusion of hydrogen released from the insulating film 26. Specifically, as the insulating film 26, a nitride insulating film can be used, and the amount of hydrogen molecules released by heating from the nitride insulating film is in the below range. The amount of hydrogen molecules released by heating is smaller than $5.0 \times 10^{21}$ molecules/cm$^3$, preferably smaller than $3.0 \times 10^{21}$ molecules/cm$^3$, further preferably smaller than $1.0 \times 10^{21}$ molecules/cm$^3$. Although entry of nitrogen released from the insulating film 26 can be suppressed by the insulating film 25 in the transistor 50, the amount of ammonia, which can serve as a source of nitrogen, in the insulating film 26 is preferably reduced as much as possible. That is, as the insulating film 26, a nitride insulating film is preferably used, and the amount of ammonia molecules released by heating from the nitride insulating film is reduced as much as possible is preferably used.

Here, a method for measuring the amount of hydrogen molecules and the amount of ammonia molecules released by thermal desorption spectroscopy (hereinafter, TDS) is described below.

The amount of released gas in the TDS analysis is proportional to an integral value of spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the amount of hydrogen molecules ($N_{H2}$) released from an insulating film can be calculated according to Formula 1 with TDS analysis results of a silicon wafer containing hydrogen at a predetermined density which is the standard sample and TDS analysis results of the insulating film. Here, all spectra having a mass number of 2 which are obtained by the TDS analysis are assumed to originate from a hydrogen molecule. An isotope of a hydrogen atom whose mass number is not 1 is not taken into consideration because the proportion of such a molecule in the natural world is minimal.

$$N_{H2} = \frac{N_{H2(S)}}{S_{H2(S)}} \times S_{H2} \times \alpha \quad \text{[Formula 1]}$$

Note that $N_{H2}$ is the amount of the released hydrogen molecules. $N_{H2(S)}$ is the value obtained by conversion of the amount of hydrogen molecules released from the standard sample into densities. $S_{H2(S)}$ is the integral value of a spectrum when the standard sample is subjected to TDS analysis. Here, the reference value of the standard sample is set to $N_{H2(S)}/S_{H2(S)}$. $S_{H2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of Formula 1. Note that the amount of hydrogen molecules released from the above insulating film is measured with a thermal desorption spectrometer produced by ESCO Ltd., EMD-WA1000S/W, using a silicon wafer containing hydrogen atoms at $1 \times 10^{16}$ atoms/cm$^2$ as the standard sample.

Further, in Formula 1, the integral value of a spectrum obtained by performing TDS on the amount of ammonia molecules released from the insulating film is substituted into $S_{H2}$, so that the amount of released ammonia molecules can be obtained.

The insulating film 26 has a thickness with which entry of water from the outside can be suppressed. For example, the thickness can become greater than or equal to 50 nm and less than or equal to 200 nm, preferably greater than or equal to 50 nm and less than or equal to 150 nm, and further preferably greater than or equal to 50 nm and less than or equal to 100 nm.

As the insulating film 26, a silicon nitride film or the like whose thickness is in the above range can be used, and the amount of hydrogen molecules released by heating from the silicon nitride film or the like is in the above range.

The silicon nitride film which can be used as the insulating film 26 can be formed using the following formation conditions. The substrate placed in a treatment chamber of the plasma CVD apparatus, which is vacuum-evacuated, is held at a temperature higher than or equal to 80° C. and lower than or equal to 400° C., preferably higher than or equal to 200° C. and lower than or equal to 370° C., the pressure is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

As the source gas of the insulating film 26, a deposition gas containing silicon, a nitrogen gas, and an ammonia gas are preferably used. Typical examples of the deposition gas containing silicon include silane, disilane, trisilane, and silane fluoride. Further, the flow rate of nitrogen is preferably 5 times to 50 times that of ammonia, further preferably 10 times to 50 times that of ammonia.

The use of ammonia as the source gas promotes decomposition of the deposition gas containing silicon and nitrogen. This is because ammonia is dissociated by plasma energy or heat energy, and energy generated by the dissociation contributes to decomposition of a bond of the deposition gas molecules containing silicon and a bond of nitrogen molecules. In this manner, entry of water can be suppressed, and a silicon nitride film having a blocking property for oxygen can be formed.

Thus, by providing the insulating films 25 and 26, the transistor 50 in which a change in electrical characteristics is suppressed can be manufactured.

As the change in electrical characteristics of the transistor 50, a change in threshold voltage of the transistor 50 over time, a change in threshold voltage of the transistor 50 due to a gate BT stress test with light irradiation, or the like can be given.

Note that a transistor using an oxide semiconductor is an n-channel transistor; therefore, in this specification, a transistor which can be regarded as having no drain current flowing therein when a gate voltage is 0 V is defined as a transistor having normally-off characteristics. In contrast, a transistor which can be regarded as having a drain current flowing therein when a gate voltage is 0 V is defined as a transistor having normally-on characteristics.

Next, the protective film 27 is described. The protective film 27 includes the insulating films 23, 24, 25 and 26. That is, the protective film 27 includes four kinds of insulating films having different functions.

In the transistor 50, the insulating film 23 is provided in contact with the oxide semiconductor film 20, the insulating film 24 is provided in contact with the oxide insulating film 23, the insulating film 25 is provided in contact with the oxide insulating film 24, and the insulating film 26 is provided in contact with the oxide insulating film 25 (see FIGS. 1B and 1C).

The insulating film 23 is an insulating film through which oxygen penetrates. For example, as the insulating film 23, an oxide insulating film through which oxygen penetrates can be used. In the insulating film 23, not all oxygen entering the insulating film 23 from the outside penetrates, but some remain in the insulating film 23. Further, there is oxygen which is contained in the insulating film 23 from the first and moves from the insulating film 23 to the outside. Thus, the insulating film 23 preferably has a high coefficient of diffusion of oxygen.

Since the insulating film 23 is in contact with the oxide semiconductor film 20, the insulating film 23 is preferably an oxide insulating film through which oxygen penetrates and which has a low interface state with the oxide semiconductor film 20. For example, the insulating film 23 is preferably an oxide insulating film having a lower defect density than the insulating film 24. Specifically, the spin density of the oxide insulating film at a g-value of 2.001 (E'-center) obtained by electron spin resonance is $3.0 \times 10^{17}$ spins/cm$^3$ or lower, preferably $5.0 \times 10^{16}$ spins/cm$^3$ or lower. Note that the spin density at a g-value of 2.001 obtained by electron spin resonance corresponds to the number of dangling bonds contained in the insulating film 23.

The thickness of the insulating film 23 can be greater than or equal to 5 nm and less than or equal to 150 nm, preferably greater than or equal to 5 nm and less than or equal to 50 nm, further preferably greater than or equal to 10 nm and less than or equal to 30 nm.

For example, as the insulating film 23, a silicon oxide film, a silicon oxynitride film, or the like which has the above spin density and a thickness in the above range can be used.

The silicon oxide film or the silicon oxynitride film which can be used as the insulating film 23 can be formed using the following formation conditions. The substrate placed in a treatment chamber of the plasma CVD apparatus, which is vacuum-evacuated, is held at a temperature higher than or equal to 180° C. and lower than or equal to 400° C., preferably higher than or equal to 200° C. and lower than or equal to 370° C., the pressure in the treatment chamber is greater than or equal to 30 Pa and less than or equal to 250 Pa, preferably greater than or equal to 40 Pa and less than or equal to 200 Pa with introduction of a source gas into the treatment chamber, and high-frequency power is supplied to an electrode provided in the treatment chamber.

As the source gas of the insulating film 23, the source gas which can be applied to the insulating film 25 can be used.

By setting the ratio of the amount of the oxidizing gas to the amount of the deposition gas containing silicon 100 or higher, the hydrogen content in the insulating film 23 can be reduced and the dangling bonds contained in the insulating film 23 can be reduced. Oxygen moving from the insulating film 24 is captured by the dangling bonds contained in the insulating film 23 in some cases; thus, in the case where the dangling bonds contained in the insulating film 23 is reduced, oxygen in the insulating film 24 can move to the oxide semiconductor film 20 efficiently to fill the oxygen vacancies in the oxide semiconductor film 20. As a result, the amount of hydrogen entering the oxide semiconductor film 20 can be reduced and oxygen vacancies contained in the oxide semiconductor film 20 can be reduced; thus, defects of initial characteristics and a change in electrical characteristics of the transistor 50 can be suppressed.

The insulating film 24 is an insulating film which contains oxygen at a higher proportion than the stoichiometric composition. For example, as the insulating film 24, an oxide insulating film which contains oxygen at a higher proportion than the stoichiometric composition can be used.

Part of oxygen is released by heating from the oxide insulating film which contains oxygen at a higher proportion than the stoichiometric composition. Therefore, when the oxide insulating film from which part of oxygen is released by heating is provided over the insulating film 23 as the insulating film 24, oxygen can move to the oxide semiconductor film 20 and oxygen vacancies in the oxide semiconductor film 20 can be compensated. Alternatively, when the insulating film 24 is formed over the insulating film 23 during heating, oxygen can move to the oxide semiconductor film 20 and oxygen vacancies in the oxide semiconductor film 20 can be compensated. Still alternatively, when the insulating film 24 is formed over the insulating film 23 and is then subjected to heat treatment, oxygen can move to the oxide semiconductor film 20 and oxygen vacancies in the oxide semiconductor film 20 can be compensated. Consequently, the number of oxygen vacancies in the oxide semiconductor film can be reduced. For example, the spin density of the oxide semiconductor film 20 (the density of oxygen vacancies in the oxide semiconductor film 20) at a g-value of 1.93 in electron spin resonance in which a magnetic field is applied in parallel to the film surface can be reduced to be lower than or equal to the lower limit of detection.

When the oxide insulating film (the insulating film 24) which contains oxygen at a higher proportion than the stoichiometric composition is provided over a back channel region of the oxide semiconductor film 20 (a surface of the oxide semiconductor film 20, which is opposite to a surface facing the gate electrode 15) with the oxide insulating film (the insulating film 23) through which oxygen penetrates provided therebetween, oxygen can move on the back channel side of the oxide semiconductor film 20, and oxygen vacancies on the back channel side can be reduced.

In the insulating film 24, the amount of oxygen molecules released by heating is preferably $1.0 \times 10^{18}$ molecules/cm$^3$ or greater. Note that an oxide insulating film with the released amount can fill at least part of oxygen vacancies contained in the oxide semiconductor film 20.

Further, in the insulating film 24 which is an oxide insulating film from which part of oxygen is eliminated tends to increase its defect density as the electrical characteristics of the transistor 50 is lowered. That is, providing the insulating film 24 in contact with the oxide semiconductor film 20 leads to a lower electrical characteristics of the transistor 50. Thus, by providing the insulating film 23 having a lower defect density than the insulating film 24, a reduction in electrical characteristics of the transistor 50 can be suppressed. Note that even in the insulating film 24, the defect density is preferably as low as possible. For example, the spin density at a g-value of 2.001 obtained by electron spin resonance is preferably $1.0 \times 10^{18}$ spins/cm$^3$ or lower.

The insulating film 24 can have a thickness of greater than or equal to 30 nm and less than or equal to 500 nm, preferably greater than or equal to 150 nm and less than or equal to 400 nm.

For example, as the insulating film 24, a silicon oxide film, a silicon oxynitride film, or the like which has the amount of oxygen molecules released by heating in the above range, the above spin density, and a thickness in the above range can be used.

The silicon oxide film or the silicon oxynitride film which can be used as the insulating film 24 can be formed using the following formation conditions. The substrate placed in a treatment chamber of the plasma CVD apparatus, which is vacuum-evacuated, is held at a temperature higher than or equal to 180° C. and lower than or equal to 250° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power that is higher than or equal to 0.17 W/cm$^2$ and lower than or equal to 0.5 W/cm$^2$, preferably, higher than or equal to 0.26 W/cm$^2$ and lower than or equal to 0.35 W/cm$^2$ is supplied to an electrode provided in the treatment chamber.

As the source gas of the insulating film 24, the source gas which can be applied to the insulating film 25 can be used.

As the formation conditions of the insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content of the insulating film 24 becomes higher than that in the stoichiometric composition. However, the bonding strength of silicon and oxygen is weak in the above substrate temperature range; therefore, part of oxygen is released by heating. Thus, it is possible to form an oxide insulating film which contains oxygen at a higher proportion than the stoichiometric composition and from which part of oxygen is released by heating. Moreover, the insulating film 23 is provided over the oxide semiconductor film 20. Accordingly, in the process for forming the insulating film 24, the insulating film 23 serves as a protective film of the oxide semiconductor film 20. Consequently, the insulating film 24 can be formed using the high-frequency power having a high power density while damage to the oxide semiconductor film 20 is reduced.

By increasing the thickness of the insulating film 24, the amount of oxygen eliminated by heating can be increased; thus, the insulating film 24 is preferably formed thicker than the insulating film 23. The coverage can be excellent by providing the insulating film 23 even in the case where the insulating film 24 has a large thickness, and thus a change in electrical characteristics of the transistor 50 can be suppressed.

As for the insulating films 25 and 26, the above description can be referred to. Since the insulating film 25 has a blocking property for oxygen, oxygen eliminated from the insulating film 24 can be made to move toward the direction of the oxide semiconductor film 20, and thus oxygen vacancies contained in the oxide semiconductor film 20 can be filled efficiently and sufficiently.

Thus, in the transistor 50, by including the protective film 27, the number of oxygen vacancies contained in the oxide semiconductor film 20 can be reduced. Further, impurities (water, hydrogen, nitrogen, or the like) entering the oxide semiconductor film 20 can be reduced. Thus, defects of initial characteristics and a change in electrical characteristics of the transistor 50 can be suppressed.

In the case where the oxygen vacancies in the oxide semiconductor film 20 can be filled without the insulating films 23 and 24, the protective film 27 may be formed of the insulating films 25 and 26. For example, heat treatment can be performed under an oxygen atmosphere. In the case where the oxide semiconductor film 20 is not damaged in the formation step of the insulating film 24, the protective film 27 may be formed of the insulating film 24, 25, and 26 without the insulating film 23.

Other details of the transistor 50 are described below.

There is no particular limitation on the property of a material and the like of the substrate 11 as long as the material has heat resistance enough to withstand at least later heat treatment. For example, a glass substrate, a ceramic substrate, a quartz substrate, a sapphire substrate, or the like may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11.

Still alternatively, a flexible substrate may be used as the substrate 11, and the transistor 50 may be provided directly on the flexible substrate. Alternatively, a separation layer may be provided between the substrate 11 and the transistor 50. The separation layer can be used when part or the whole of a semiconductor device formed over the separation layer is separated from the substrate 11 and transferred onto another substrate. In such a case, the transistor 50 can move to a substrate having low heat resistance or a flexible substrate as well.

The base insulating film 13 may be provided between the substrate 11 and the gate electrode 15. As the base insulating film 13, a silicon oxide film, a silicon oxynitride film, a silicon nitride film, a silicon nitride oxide film, a gallium oxide film, a hafnium oxide film, an yttrium oxide film, an aluminum oxide film, an aluminum oxynitride film, and the like can be given as examples. Note that when a silicon nitride film, a gallium oxide film, a hafnium oxide film, an yttrium oxide film, an aluminum oxide film, or the like is used as the base insulating film 13, it is possible to suppress diffusion of impurities (typically, an alkali metal, water, hydrogen, and the like) into the oxide semiconductor film 20 from the substrate 11. Note that in this specification, a "silicon oxynitride film" refers to a film that includes more oxygen than nitrogen, and a "silicon nitride oxide film" refers to a film that includes more nitrogen than oxygen.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. Further, the gate electrode 15 may have a single-layer structure or a stacked-layer structure of two or more layers. A single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; and a three-layer structure in which a titanium film, an aluminum film, and a titanium film are stacked in this order can be given as examples. Alternatively, a film, an alloy film, or a nitride film which contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a metal nitride film (such as an InN film or a ZnN film), or the like may be provided between the gate electrode 15 and the gate insulating film 18. These films each have a work function higher than or equal to 5 eV, preferably higher than or equal to 5.5 eV, which is higher than the electron affinity of an oxide semiconductor; thus, the threshold voltage of a transistor including the oxide semiconductor can be shifted in the positive direction. Accordingly, a switching element having what is called normally-off characteristics can be obtained. For example, in the case of using an In—Ga—Zn-based oxynitride semiconductor film, an In—Ga—Zn-based oxynitride semiconductor film having a higher nitrogen concentration than at least the oxide semiconductor film 20, specifically, an In—Ga—Zn-based oxynitride semiconductor film having a nitrogen concentration higher than or equal to 7 at. %, is used.

The gate insulating film 18 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, and a Ga—Zn-based metal oxide film.

The gate insulating film 18 may be formed using an oxide insulator from which oxygen is released by heating. With the use of an oxide insulating film from which oxygen is released by heating as the gate insulating film 18, interface states at the interface between the oxide semiconductor film 20 and the gate insulating film 18 can be reduced; accordingly, a transistor with excellent initial characteristics can be obtained.

It is possible to suppress outward diffusion of oxygen from the oxide semiconductor film 20 and entry of hydrogen, water, or the like into the oxide semiconductor film 20 from the outside by providing an insulating film having a blocking effect against oxygen, hydrogen, water, and the like for the gate insulating film 18. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples. For the gate insulating film 18, a silicon nitride film or a silicon nitride oxide film which is an insulating film having a blocking effect against hydrogen and water can be used.

By using a silicon nitride film as the gate insulating film 18, the following effect can be obtained. The silicon nitride film has a higher relative permittivity than a silicon oxide film and needs a larger thickness for an equivalent capacitance. Thus, the physical thickness of the gate insulating film can be increased. This makes it possible to suppress a decrease in withstand voltage of the transistor 50 and furthermore improve the withstand voltage, thereby suppressing electrostatic discharge damage to a semiconductor device. Accordingly, the yield of the transistor 50 can be improved. In a silicon nitride film which can be used for the insulating film 26, the amount of hydrogen is reduced; thus, the silicon nitride film which can be used for the insulating film 26 can be used for the gate insulating film 18, so that electrostatic discharge damage and entry of hydrogen from a portion under the gate insulating film 18 can be suppressed.

Further, in the case where copper is used for the gate electrode 15 and a silicon nitride film is used as the gate insulating film 18 in contact with the gate electrode 15, as the gate insulating film 18, a silicon nitride film is preferably used, and the amount of ammonia molecules released by heating from the silicon nitride film is reduced as much as possible. Thus, as the silicon nitride film, a silicon nitride film which can be used as the nitride insulating film 25 can be used. As a result, reaction between copper and ammonia molecules can be suppressed.

The gate insulating film 18 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 18 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

The oxide semiconductor film 20 preferably contains at least indium (In) or zinc (Zn). Alternatively, the oxide semiconductor film 20 preferably contains both In and Zn. In order to reduce variation in electrical characteristics of the transistors including the oxide semiconductor film, the oxide semiconductor preferably contains one or more of stabilizers in addition to In or Zn.

As for stabilizers, gallium (Ga), tin (Sn), hafnium (Hf), aluminum (Al), zirconium (Zr), and the like can be given. As another stabilizer, lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and the like can be given.

As the oxide semiconductor, for example, the following can be used: indium oxide, tin oxide; zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, an In—Ga-based metal oxide, or an In—W-based metal oxide; a three-component metal oxide such as an In—Ga—Zn-based metal oxide (also referred to as an IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

Note that, for example, an In—Ga—Zn-based metal oxide means an oxide containing In, Ga, and Zn as its main components and there is no particular limitation on the ratio of In, Ga, and Zn. The In—Ga—Zn-based metal oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, it is possible to use an In—Ga—Zn-based metal oxide containing In, Ga, and Zn at an atomic ratio of 1:1:1 (=1/3:1/3:1/3), 2:2:1 (=2/5:2/5:1/5), or 3:1:2 (=1/2:1/6:1/3), or any of oxides whose composition is in the neighborhood of the above compositions. Alternatively, an In—Sn—Zn-based metal oxide containing In, Sn, and Zn at an atomic ratio of 1:1:1 (=1/3:1/3:1/3), 2:1:3 (=1/3:1/6:1/2), or 2:1:5 (=1/4:1/8:5/8), or any of oxides whose composition is in the neighborhood of the above compositions may be used.

However, the composition is not limited to those described above, and a material having the appropriate composition may be used depending on needed semiconductor characteristics and electrical characteristics (e.g., field-effect mobility, threshold voltage, and variation). In order to obtain needed semiconductor characteristics, it is preferable that the carrier density, the impurity concentration, the defect density, the atomic ratio of a metal element and oxygen, the interatomic distance, the density, and the like be set to be appropriate.

For example, a high mobility can be obtained relatively easily in the case where the In—Sn—Zn-based metal oxide is used. However, the mobility can be increased by reducing the defect density in the bulk also in the case where the In—Ga—Zn-based metal oxide is used.

Further, an oxide semiconductor that can be used for the oxide semiconductor film 20 has an energy gap of greater than or equal to 2 eV, preferably greater than or equal to 2.5 eV, more preferably greater than or equal to 3 eV. In this manner, the off-state current of a transistor can be reduced by using an oxide semiconductor having a wide energy gap.

Note that the oxide semiconductor film 20 may have an amorphous structure, a single crystal structure, or a polycrystalline structure.

As the oxide semiconductor film 20, a c-axis aligned crystalline oxide semiconductor film (also referred to as a CAAC-OS film) having crystal parts may be used.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film.

Thus, for example, in the case where a shape of the CAAC-OS film is changed by etching or the like, the c-axis might not be necessarily parallel to the normal vector of the formation surface or the normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor using the CAAC-OS film, a change in electrical characteristics due to irradiation with visible light or ultraviolet light is small. Thus, the transistor has high reliability.

Alternatively, the oxide semiconductor film 20 may have a stacked-layer structure of a plurality of oxide semiconductor films. For example, the oxide semiconductor film 20 may have a stacked-layer structure of a first oxide semiconductor film and a second oxide semiconductor film which are formed using metal oxides with different compositions. Alternatively, for example, the first oxide semiconductor film may be formed using any of a two-component metal oxide, a three-component metal oxide, and a four-component metal oxide, and the second oxide semiconductor film may be formed using any of these which is different from the oxide for the first oxide semiconductor film.

Further, the constituent elements of the first oxide semiconductor film and the second oxide semiconductor film may be made the same and the composition of the constituent elements of the first oxide semiconductor film and the second oxide semiconductor film may be made different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor varies within a range of ±20% as an error.

At this time, one of the first oxide semiconductor film and the second oxide semiconductor film, which is closer to the gate electrode (on the channel side), preferably contains In and Ga at a proportion of In>Ga. The other oxide semiconductor film, which is farther from the gate electrode (on the back channel side) preferably contains In and Ga at a proportion of In≤Ga.

Further, the oxide semiconductor film 20 may have a three-layer structure of a first oxide semiconductor film, a second oxide semiconductor film, and a third oxide semiconductor film, in which the constituent elements thereof is made the same and the composition of the constituent elements of the first oxide semiconductor film, the second oxide semiconductor film, and the third oxide semiconductor film is made different. For example, the first oxide semiconductor film may contain In, Ga, and Zn at an atomic ratio of 1:3:2, the second oxide semiconductor film may contain In, Ga, and Zn at an atomic ratio of 3:1:2, and the third oxide semiconductor film may contain In, Ga, and Zn at an atomic ratio of 1:1:1.

As compared to an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film, an oxide semiconductor film which contains less In than Ga and Zn at an atomic ratio, typically, the first oxide semiconductor film containing In, Ga, and Zn at an atomic ratio of 1:3:2, has few oxygen vacancies, and thus can suppress an increase in carrier density. Further, when the first oxide semiconductor film containing In, Ga, and Zn at an atomic ratio of 1:3:2 has an amorphous structure, the second oxide semiconductor film is likely to be a CAAC-OS film.

Since the constituent elements of the first oxide semiconductor film, the second oxide semiconductor film, and the third oxide semiconductor film are the same, the first oxide semiconductor film has fewer defect states (trap levels) at the interface with the second oxide semiconductor film. Therefore, when the oxide semiconductor film 20 has the above structure, the amount of change in threshold voltage of the transistor due to a change over time or a BT photostress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide containing In and Ga at a proportion of In>Ga has higher carrier mobility than an oxide containing In and Ga at a proportion of In≤Ga. Further, in Ga, the formation energy of an oxygen vacancy is larger and thus an oxygen vacancy is less likely to occur, than in In; therefore, the oxide containing In and Ga at a proportion of In≤Ga has more stable characteristics than the oxide containing In and Ga at a proportion of In>Ga.

An oxide semiconductor containing In and Ga at a proportion of In>Ga is used on the channel side, and an oxide semiconductor containing In and Ga at a proportion of In≤Ga is used on the back channel side, so that the field-effect mobility and the reliability of the transistor can be further improved.

Further, the first oxide semiconductor film, the second oxide semiconductor film, and the third oxide semiconductor film may be formed using oxide semiconductors having different crystallinity. That is, the oxide semiconductor film 20 may be formed using any of a single crystal oxide semiconductor, a polycrystalline oxide semiconductor, an amorphous oxide semiconductor, and a CAAC-OS, as appropriate. When an amorphous oxide semiconductor is used for either the first oxide semiconductor film or the second oxide semiconductor film, internal stress or external stress of the oxide semiconductor film 20 is relieved, variation in characteristics of the transistor is reduced, and the reliability of the transistor can be further improved.

The thickness of the oxide semiconductor film 20 is preferably greater than or equal to 1 nm and less than or equal to 100 nm, more preferably greater than or equal to 1 nm and less than or equal to 30 nm, still more preferably greater than or equal to 1 nm and less than or equal to 50 nm, further preferably greater than or equal to 3 nm and less than or equal to 20 nm.

The concentration of alkali metals or alkaline earth metals in the oxide semiconductor film 20, which is obtained by secondary ion mass spectrometry (SIMS), is preferably lower than or equal to $1\times10^{18}$ atoms/cm$^3$, more preferably lower than or equal to $2\times10^{16}$ atoms/cm$^3$. This is because, when alkali metals or alkaline earth metals are bonded to an oxide semiconductor, some of the alkali metals or the alkaline earth metals generate carriers and cause an increase in the off-state current of the transistor.

In the oxide semiconductor film 20, the hydrogen concentration obtained by secondary ion mass spectrometry is preferably smaller than $5\times10^{18}$ atoms/cm$^3$, further preferably smaller than or equal to $1\times10^{18}$ atoms/cm$^3$, still further preferably smaller than or equal to $5\times10^{17}$ atoms/cm$^3$, yet still further preferably smaller than or equal to $1\times10^{16}$ atoms/cm$^3$.

Hydrogen contained in the oxide semiconductor film 20 reacts with oxygen bonded to a metal atom to produce water, and a defect is formed in a lattice from which oxygen is released (or a portion from which oxygen is removed). In addition, a bond of part of hydrogen and oxygen causes generation of electrons serving as a carrier. Thus, the impurities containing hydrogen are reduced as much as possible in the step of forming the oxide semiconductor film, whereby the hydrogen concentration in the oxide semiconductor film can be reduced. By using a highly purified oxide semiconductor film from which hydrogen is removed as much as possible as a channel region, a shift of the threshold voltage in the negative direction can be reduced, and leakage current between a source and a drain of the transistor, typically, the off-state current can be decreased. As a result, the electrical characteristics of the transistor can be improved.

Note that various experiments can prove low off-state current of a transistor including a highly purified oxide semiconductor film as a channel formation region. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In this case, it can be seen that the off-state current is 100 zA/mm or lower. Further, the off-state current was measured with the use of a circuit in which a capacitor and a transistor are connected to each other and charge that flows in or out from the capacitor is controlled by the transistor. In the measurement, a purified oxide semiconductor film has been used for a channel formation region of the transistor, and the off-state current of the transistor has been measured from a change in the amount of charge of the capacitor per unit time. As a result, it is found that in the case where the voltage between the source electrode and the drain electrode of the transistor is 3 V, lower off-state current of several tens of yoctoamperes per micrometer (yA/μm) can be obtained. Consequently, the transistor including the highly purified oxide semiconductor film as the channel formation region has extremely small off-state current.

The concentration of nitrogen in the oxide semiconductor film 20 is preferably lower than or equal to $5\times10^{18}$ atoms/cm$^3$.

The pair of electrodes 21 is formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used.

Next, a method for manufacturing the transistor 50 illustrated in FIGS. 1A to 1C is described with reference to FIGS. 2A to 2D.

As illustrated in FIG. 2A, the gate electrode 15 is formed over the substrate 11, and the gate insulating film 18 is formed over the gate electrode 15.

A formation method of the gate electrode 15 is described below. First, a conductive film is formed by a sputtering method, a CVD method, an evaporation method, or the like and then a mask is formed over the conductive film by a photolithography process. Then, part of the conductive film is etched using the mask to form the gate electrode 15. After that, the mask is removed.

Note that instead of the above formation method, the gate electrode 15 may be formed by an electrolytic plating method, a printing method, an ink-jet method, or the like.

Here, a 100-nm-thick tungsten film is formed by a sputtering method. Then, a mask is formed by a photolithography process and the tungsten film is dry-etched using the mask to form the gate electrode 15.

The gate insulating film 18 is formed by a sputtering method, a CVD method, an evaporation method, or the like.

In the case where the gate insulating film 18 is formed using a silicon oxide film, a silicon oxynitride film, or a silicon nitride oxide film, a deposition gas containing silicon and an oxidizing gas are preferably used as a source gas. As typical examples of the deposition gas containing silicon, silane, disilane, trisilane, and silane fluoride can be given. As the oxidizing gas, oxygen, ozone, dinitrogen monoxide, nitrogen dioxide, and the like can be given as examples.

In the case where a silicon nitride film is formed as the gate insulating film 18, it is preferable to use, instead of a formation method of a silicon nitride film which can be used as the insulating film 26, the following formation method. This formation method has two steps. First, a first silicon nitride film with few defects is formed by a plasma CVD method in which a mixed gas of silane, nitrogen, and ammonia is used as a source gas. Then, a second silicon nitride film in which the hydrogen concentration is low and hydrogen can be blocked is formed by switching the source gas to a mixed gas of silane and nitrogen. With such a formation method, a silicon nitride film having few defects and a blocking effect against hydrogen can be formed as the gate insulating film 18.

Moreover, in the case where a gallium oxide film is formed as the gate insulating film 18, a metal organic chemical vapor deposition (MOCVD) method can be used.

Figure 2B:
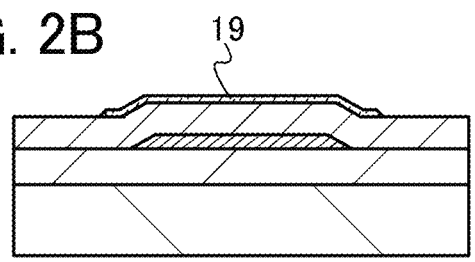

Next, as illustrated in FIG. 2B, an oxide semiconductor film 19 is formed over the gate insulating film 18.

A formation method of the oxide semiconductor film 19 is described below. An oxide semiconductor film is formed over the gate insulating film 18 by a sputtering method, a coating method, a pulsed laser deposition method, a laser ablation method, or the like. Then, after a mask is formed over the oxide semiconductor film by a photolithography process, the oxide semiconductor film is partly etched using the mask. Accordingly, the oxide semiconductor film 19 which is over the gate insulating film 18 and subjected to element isolation so as to partly overlap with the gate electrode 15 is formed as illustrated in FIG. 2B. After that, the mask is removed.

Alternatively, by using a printing method for forming the oxide semiconductor film 19, the oxide semiconductor film 19 subjected to element isolation can be formed directly.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

A CAAC-OS film is formed by, for example, a sputtering method using a polycrystalline oxide semiconductor sputtering target. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby the CAAC-OS film can be deposited.

For the deposition of the CAAC-OS film, the following conditions are preferably used.

By reducing the number of impurities entering the CAAC-OS film during the deposition, the crystal state can be prevented from being broken by the impurities. For example, reducing the concentration of impurities (e.g., hydrogen, water, carbon dioxide, and nitrogen) which exist in the deposition chamber is favorable. Furthermore, the concentration of impurities in a deposition gas can be reduced. Specifically, a deposition gas whose dew point is lower than or equal to −80° C., preferably lower than or equal to −100° C., can be used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn-based metal oxide target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, after the oxide semiconductor film is formed, heat treatment may be performed so that the oxide semiconductor film is subjected to dehydrogenation or dehydration. The heating temperature is typically higher than or equal to 150° C. and lower than the strain point of the substrate, preferably higher than or equal to 200° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like.

By performing heat treatment after the oxide semiconductor film is formed, the concentration of hydrogen contained in the oxide semiconductor film 20 can be smaller than $5 \times 10^{18}$ atoms/cm$^3$, preferably smaller than or equal to $1 \times 10^{18}$ atoms/cm$^3$, further preferably smaller than or equal to $5 \times 10^{17}$ atoms/cm$^3$, still further preferably smaller than or equal to $1 \times 10^{16}$ atoms/cm$^3$.

Here, a 35-nm-thick oxide semiconductor film is formed by a sputtering method, a mask is formed over the oxide semiconductor film, and then part of the oxide semiconductor film is selectively etched. Accordingly, the oxide semiconductor film 19 is formed.

Figure 2C:
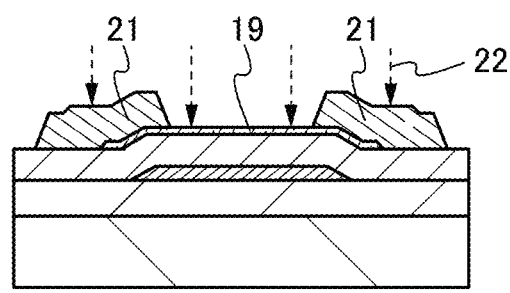

Next, as illustrated in FIG. 2C, the pair of electrodes 21 is formed.

A formation method of the pair of electrodes 21 is described below. First, a conductive film is formed by a sputtering method, a CVD method, an evaporation method, or the like. Then, a mask is formed over the conductive film by a photolithography process. After that, the conductive film is etched using the mask to form the pair of electrodes 21. Then, the mask is removed.

Here, a 50-nm-thick tungsten film, a 400-nm-thick aluminum film, and a 100-nm-thick titanium film are sequentially stacked by a sputtering method. Then, a mask is formed over the titanium film by a photolithography process and the tungsten film, the aluminum film, and the titanium film are dry-etched using the mask to form the pair of electrodes 21.

After the pair of electrodes 21 is formed, cleaning treatment is preferably performed to remove an etching residue. A short circuit of the pair of electrodes 21 can be suppressed by this cleaning treatment. The cleaning treatment can be performed using an alkaline solution such as a tetramethylammonium hydroxide (TMAH) solution; an acidic solution such as a hydrofluoric acid solution or an oxalic acid solution; or water.

Figure 2D:
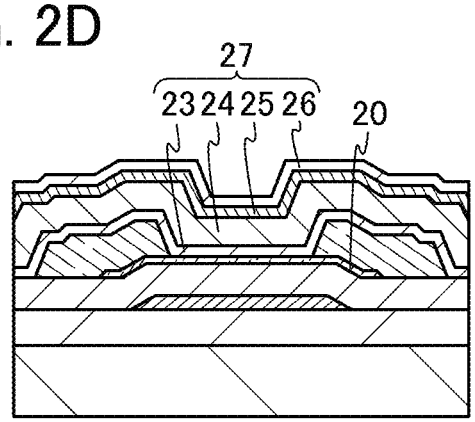

Next, the oxide semiconductor film 20 illustrated in FIG. 2D may be formed in such a manner that the oxide semiconductor film 19 is exposed to plasma generated in an oxygen atmosphere to be supplied with oxygen 22 as illustrated in FIG. 2C. As an oxygen atmosphere, atmospheres of oxygen, ozone, dinitrogen monoxide, nitrogen dioxide, and the like can be given as examples. Further, in the plasma treatment, the oxide semiconductor film 19 is preferably exposed to plasma generated with no bias applied to the substrate 11 side. Consequently, the oxide semiconductor film 19 can be supplied with oxygen without being damaged; accordingly, the number of oxygen vacancies in the oxide semiconductor film 20 can be reduced.

Here, the oxide semiconductor film 20 is formed by exposing the oxide semiconductor film 19 to oxygen plasma which is generated in such a manner that dinitrogen monoxide is introduced into a treatment chamber of a plasma CVD apparatus, and an upper electrode provided in the treatment chamber is supplied with high-frequency power of 150 W with the use of a 27.12 MHz high-frequency power source. Note that a plasma CVD apparatus used here is a parallel plate plasma CVD apparatus in which the electrode area is 6000 cm$^2$, and the power per unit area (power density) into which the supplied power is converted is $2.5 \times 10^{-2}$ W/cm$^2$.

The surface of the oxide semiconductor film 19 is exposed to plasma generated in an oxygen atmosphere to be able to be supply oxygen to the oxide semiconductor film 19, whereby the number of oxygen vacancies in the oxide semiconductor film can be reduced. Moreover, impurities remaining on the surface of the oxide semiconductor film 19 due to the etching treatment, for example, a halogen such as fluorine or chlorine, can be removed.

Heat treatment is preferably performed on the oxide semiconductor film 19 before the plasma treatment. For example, this heat treatment can be performed in a manner similar to that of the heat treatment performed after the oxide semiconductor film 19 is formed.

Next, the protective film 27 is formed over the oxide semiconductor film 20 and the pair of electrodes 21. Specifically, the insulating film 23, the insulating film 24, the insulating film 25, and the insulating film 26 are sequentially formed over the oxide semiconductor film 20 and the pair of electrodes 21. At this time, the insulating film 23 is formed without exposure to the atmosphere after the oxide semiconductor film 20 is formed by the above plasma treatment, whereby the concentration of impurities at the interface between the oxide semiconductor film 20 and the insulating film 23 can be reduced.

It is preferable to form the insulating films 24 to 26 in succession without exposure to the atmosphere, directly after the insulating film 23 is formed. After the insulating film 23 is formed, the insulating film 24 is formed in succession by adjusting at least one of the flow rate of the source gas, the pressure, the high-frequency power, and the substrate temperature without exposure to the atmosphere, whereby the concentration of impurities at the interface between the insulating film 23 and the insulating film 24 can be reduced and further oxygen contained in the insulating film 24 can move to the oxide semiconductor film 20; accordingly, the number of oxygen vacancies in the oxide semiconductor film 20 can be reduced.

After the insulating film 24 is formed, the insulating film 25 is formed in succession by adjusting at lease one of the flow rate of the source gas, the pressure, the high-frequency power, and the substrate temperature without exposure to the atmosphere, whereby the concentration of impurities at the interface between the insulating film 24 and the insulating film 25 can be reduced. Accordingly, the interface state can be reduced.

After the insulating film 25 is formed, the insulating film 26 is formed in succession by adjusting at lease one of the flow rate of the source gas, the pressure, the high-frequency power, and the substrate temperature without exposure to the atmosphere, whereby the concentration of impurities at the interface between the insulating film 25 and the insulating film 26 can be reduced. Accordingly, the interface state can be reduced.

For the formation methods of the insulating films 23 to 26, the above description can be referred to.

In this embodiment, a silicon oxynitride film is formed to have a thickness of 50 nm as the insulating film 23 by a plasma CVD method. The plasma CVD method is performed in the following conditions: the source gas is silane and dinitrogen monoxide which have a flow rate of 20 sccm and a flow rate of 3000 sccm, respectively; the pressure of a treatment chamber is 40 Pa; the substrate temperature is 220° C.; and parallel plate electrodes are supplied with high-frequency power of 100 W with the use of a 27.12 MHz high-frequency power source. Note that a plasma CVD apparatus is a parallel plate plasma CVD apparatus in which the electrode area is 6000 cm$^2$, and the power per unit area (power density) into which the supplied power is converted is $1.6 \times 10^{-1}$ W/cm$^2$.

In this embodiment, a silicon oxynitride film is formed to have a thickness of 400 nm as the insulating film 24 by a plasma CVD method. The plasma CVD method is performed in the following conditions: the source gas is silane and dinitrogen monoxide which have a flow rate of 160 sccm and a flow rate of 4000 sccm, respectively; the pressure of the treatment chamber is 200 Pa; the substrate temperature is 220° C.; and parallel plate electrodes are supplied with high-frequency power of 1500 W with the use of a 27.12 MHz high-frequency power source. Note that a plasma CVD apparatus is a parallel plate plasma CVD apparatus in which the electrode area is 6000 cm$^2$, and the power per unit area (power density) into which the supplied power is converted is $2.5 \times 10^{-1}$ W/cm$^2$.

In this embodiment, a silicon oxynitride film is formed to have a thickness of 115 nm as the insulating film 25 by a plasma CVD method. The plasma CVD method is performed in the following conditions: the source gas is silane and dinitrogen monoxide which have a flow rate of 20 sccm and a flow rate of 3000 sccm, respectively; the pressure of the treatment chamber is 200 Pa; the substrate temperature is 350° C.; and parallel plate electrodes are supplied with high-frequency power of 100 W with the use of a 27.12 MHz high-frequency power source. Note that a plasma CVD apparatus is a parallel plate plasma CVD apparatus in which the electrode area is 6000 cm$^2$, and the power per unit area (power density) into which the supplied power is converted is $1.6 \times 10^{-1}$ W/cm$^2$.

In this embodiment, a silicon nitride film is formed to have a thickness of 50 nm as the insulating film 26 by a plasma CVD method. The plasma CVD method is performed in the following conditions: the source gas is silane, nitrogen, and ammonia which have a flow rate of 50 sccm, a flow rate of 5000 sccm, and a flow rate of 100 sccm, respectively; the pressure of the treatment chamber is 200 Pa; the substrate temperature is 220° C.; and parallel plate electrodes are supplied with high-frequency power of 1000 W with the use of a 27.12 MHz high-frequency power source. Note that a plasma CVD apparatus is a parallel plate plasma CVD apparatus in which the electrode area is 6000 cm$^2$, and the power per unit area (power density) into which the supplied power is converted is $1.6 \times 10^{-1}$ W/cm$^2$.

Note that heat treatment is performed before the insulating film 26 is formed. By the heat treatment, water (including hydrogen) contained in the insulating films 23 to 25 can be removed and at least oxygen eliminated from the insulating film 24 is made to move to the oxide semiconductor film 20, so that the oxygen vacancies in the oxide semiconductor film 20 can be filled. The heat treatment can be performed in a manner similar to the heat treatment performed after the formation of the oxide semiconductor film 19 and the heat treatment performed before the plasma treatment.

Here, the heat treatment is performed at 350° C. for 1 hour in an atmosphere of nitrogen and oxygen.

After the insulating film 26 is formed, heat treatment which is similar to the heat treatment performed before the formation of the insulating film 26 may be performed.

Through the above-described process, the transistor 50 can be manufactured.

The structure, method, and the like described in this embodiment can be used in combination with structures, methods, and the like described in other embodiments and examples, as appropriate.

Embodiment 2

Figure 3:
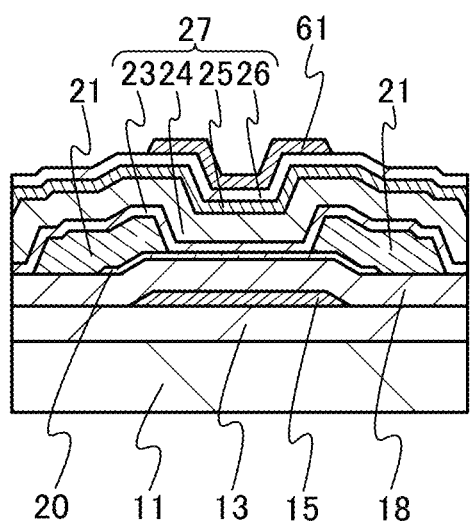
FIG. 3 is a cross-sectional view illustrating one embodiment of a transistor.

In this embodiment, a transistor having a structure different from that of Embodiment 1 is described with reference to FIG. 3. A transistor 70 of this embodiment includes a plurality of gate electrodes facing each other with an oxide semiconductor film provided therebetween.

The transistor 70 includes the gate electrode 15 provided over the substrate 11. Further, in the transistor 70, the gate insulating film 18 is provided over the substrate 11 and the gate electrode 15, the oxide semiconductor film 20 is provided to overlap with the gate electrode 15 with the gate insulating film 18 provided therebetween, and the pair of electrodes 21 is provided in contact with the oxide semiconductor film 20. In the transistor 70, at least the insulating films 25 and 26 are provided over the gate insulating film 18, the oxide semiconductor film 20, and the pair of electrodes 21. A gate electrode 61 is provided over the insulating film 26 to overlap with the oxide semiconductor film 20. As well as the transistor 50, the transistor 70 preferably includes the protective film 27 which is formed of the insulating films 23 and 24 provided between the insulating film 25 and the oxide semiconductor film 20 and the insulating films 25 and 26 (see FIG. 3).

The gate electrode 61 can be formed in a manner similar to that of the gate electrode 15 of Embodiment 1. Other components of the transistor 70 are the same as those in Embodiment 1.

The transistor 70 has the gate electrode 15 and the gate electrode 61 facing each other with the oxide semiconductor film 20 provided therebetween. By applying different potentials to the gate electrode 15 and the gate electrode 61, the threshold voltage of the transistor 70 can be controlled. Alternatively, by applying the same potential to the gate electrode 15 and the gate electrode 61, an on-state current of the transistor 70 can be increased. Moreover, the transistor 70 includes the oxide semiconductor film 20 whose surface is exposed to plasma generated in an oxidizing atmosphere and the protective film 27 which is formed in succession after the plasma treatment, whereby impurities between the oxide semiconductor film 20 and the gate electrode 61 can be reduced, and a change in electrical characteristics (variation in the threshold voltage) of the transistor 70 can be suppressed. Further, since the transistor 70 includes the oxide semiconductor film 20 in which the number of oxygen vacancies is reduced, defects of initial characteristics of the transistor 70 can be suppressed.

The structure, method, and the like described in this embodiment can be used in combination with structures, methods, and the like described in other embodiments and examples, as appropriate.

Embodiment 3

A semiconductor device (also referred to as a display device) having a display function can be manufactured using the transistor of one embodiment of the present invention. Moreover, some or all of the driver circuits of the semiconductor device can be formed over a substrate where the pixel portion is formed, whereby a system-on-panel can be obtained.

Figure 4A:
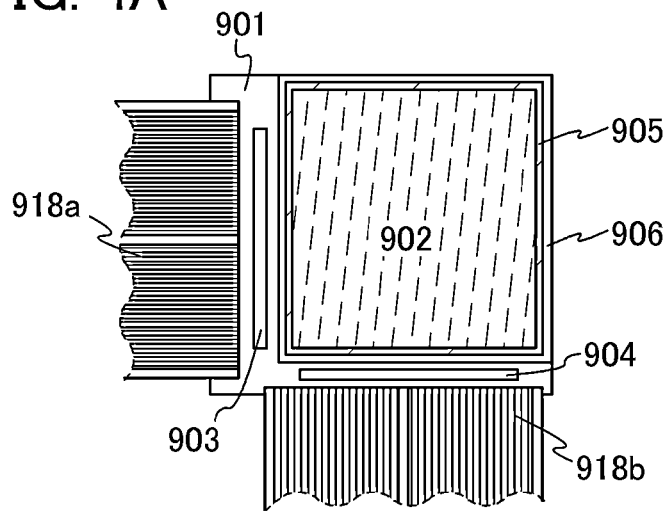
FIGS. 4A to 4C are top views illustrating one embodiment of a display device.

In FIG. 4A, a sealant 905 is provided so as to surround a pixel portion 902 provided over a substrate 901, and the pixel portion 902 is sealed with a substrate 906. In FIG. 4A, a signal line driver circuit 903 and a scan line driver circuit 904 each are formed using a single crystal semiconductor film or a polycrystalline semiconductor film over an IC chip or a substrate prepared separately, and mounted in a region different from the region surrounded by the sealant 905 over the substrate 901. Further, various signals and potentials which are provided to the pixel portion 902 through the signal line driver circuit 903 and the scan line driver circuit 904 are supplied from flexible printed circuits (FPCs) 918a and 918b.

Figure 4B:
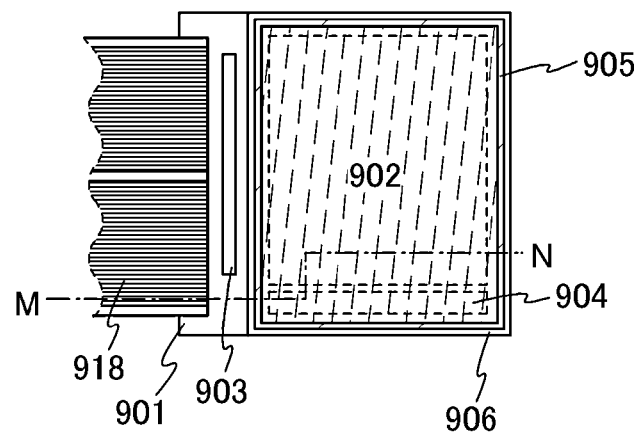
Figure 4C:
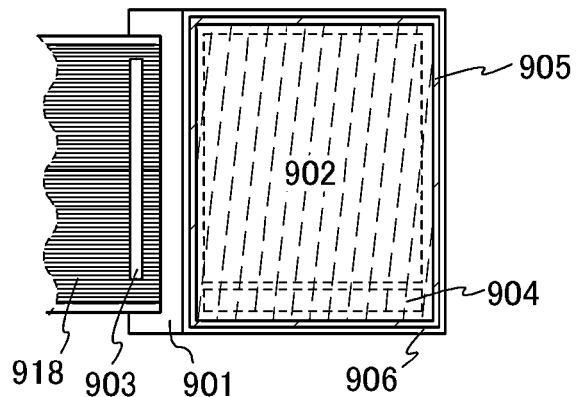

In FIGS. 4B and 4C, the sealant 905 is provided so as to surround the pixel portion 902 and the scan line driver circuit 904 which are provided over the substrate 901. The substrate 906 is provided over the pixel portion 902 and the scan line driver circuit 904. Thus, the pixel portion 902 and the scan line driver circuit 904 are sealed together with a display element by the substrate 901, the sealant 905, and the substrate 906. In FIGS. 4B and 4C, the signal line driver circuit 903 which is formed using a single crystal semiconductor film or a polycrystalline semiconductor film over an IC chip or a substrate separately prepared is mounted in a region different from the region surrounded by the sealant 905 over the substrate 901. In FIGS. 4B and 4C, various signals and potentials which are provided to the pixel portion 902 through the signal line driver circuit 903 and the scan line driver circuit 904 are supplied from an FPC 918.

Although FIGS. 4B and 4C each show an example in which the signal line driver circuit 903 is formed separately and mounted on the substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 4A shows an example in which the signal line driver circuit 903 and the scan line driver circuit 904 are mounted by a COG method. FIG. 4B shows an example in which the signal line driver circuit 903 is mounted by a COG method. FIG. 4C shows an example in which the signal line driver circuit 903 is mounted by a TAB method.

The display device includes in its category a panel in which a display element is sealed and a module in which an IC including a controller or the like is mounted on the panel. A display device in this specification refers to an image display device, a display device, or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion 902 and the scan line driver circuit 904 provided over the substrate 901 include a plurality of transistors and the transistor of one embodiment of the present invention can be used.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes organic electroluminescence (EL), inorganic EL, and the like. Further, as the display element, a display medium whose contrast is changed by an electric effect, such as electronic ink, can be used. As a display device using the display medium, electronic paper or the like is given.

One embodiment of a display device is described with reference to drawings. FIGS. 5A and 5B correspond to cross-sectional views along line M-N in FIG. 4B. An example of a liquid crystal display device using a liquid crystal element as a display element is illustrated in FIG. 5A and FIG. 5B.

A vertical electric field type or a horizontal electric field type (including an oblique electric field type) can be applied to the liquid crystal display device. FIG. 5A shows an example to which the vertical electric field type is applied, and FIG. 5B shows an example to which a fringe field switching (FFS) mode is applied as an example of the horizontal electric field type.

Note that in a display panel, a transistor 910 provided in the pixel portion 902 is electrically connected to a liquid crystal element. There is no particular limitation on the kind of the display element as long as display can be performed, and various kinds of modes of display elements can be used.

As illustrated in FIG. 4B and FIGS. 5A and 5B, the display device includes a connection terminal electrode 915 and a terminal electrode 916. The connection terminal electrode 915 and the terminal electrode 916 are electrically connected to a terminal included in the FPC 918 through an anisotropic conductive film 919.

The connection terminal electrode 915 is formed using a conductive film which is formed in the formation step of a pixel electrode 934, and the terminal electrode 916 is formed using a conductive film which is formed in the formation step of gate electrodes in the transistor 910 and a transistor 911.

In the liquid crystal display devices illustrated in FIGS. 5A and 5B, each of the pixel portion 902 and the scan line driver circuit 904 which are provided over the substrate 901 includes a plurality of transistors. FIGS. 5A and 5B illustrate the transistor 910 included in the pixel portion 902 and the transistor 911 included in the scan line driver circuit 904.

The transistor of one embodiment of the present invention can be used as the transistor 910 and the transistor 911. In this embodiment, an example in which a transistor having a structure similar to that of the transistor 70 described in Embodiment 2 is used as the transistor 911, and a transistor having a structure similar to that of the transistor 50 described in Embodiment 1 is used as each of the transistor 910 is described.

That is, the transistor 910 in the pixel portion 902 includes an oxide semiconductor film in which a channel formation region is formed and oxygen vacancies are sufficiently filled, an insulating film which is over the oxide semiconductor film, suppresses entry of water, and contains at least nitrogen, and an insulating film which suppresses entry of nitrogen released form the insulating film. Thus, as well as the transistor 50, the transistor 910 is a transistor of which defects of initial characteristics and a change in electrical characteristics is suppressed.

The transistor 911 of the scan line driver circuit 904 includes a gate electrode (also referred to as a back gate electrode) in a portion which is over an insulating film 932 and overlaps with a channel formation region of the oxide semiconductor film. Thus, as well as the transistor 70, the transistor 911 is a transistor of which defects of initial characteristics and a change in electrical characteristics is suppressed. The gate electrode also has a function of blocking an external electric field, that is, a function of preventing an external electric field (particularly, a function of preventing static electricity) from affecting the inside (circuit portion including a transistor). A blocking function of the gate electrode can prevent a change in the electrical characteristics of the transistor due to the effect of external electric field such as static electricity. Forming a conductive film through the formation step of the pixel electrode 934 over the transistor 911 (the scan line driver circuit 904) and making the potential of the conductive film a ground potential or the like can be a blocking function.

In each of the liquid crystal display devices in FIGS. 5A and 5B, the transistors 910 and 911 are provided with the insulating film 932. The insulating film 932 corresponds to the protective film 27 in the transistors 50 and 70. Thus, the insulating film 932 suppresses entry of water, and includes at least an insulating film (the insulating film 26 in FIGS. 1A to 1C and FIG. 3) which contains at least nitrogen and an insulating film (the insulating film 25 in FIGS. 1A to 1C and FIG. 3) which suppresses entry of nitrogen released form the insulating film.

Further, a planarization insulating film 940 is provided over the insulating film 932. For the planarization insulating film 940, a heat-resistant organic material such as an acrylic resin, polyimide, a benzocyclobutene-based resin, polyamide, or an epoxy resin can be used. As an alternative to such organic materials, it is possible to use a low-dielectric constant material (low-k material) such as a siloxane-based resin. Note that the planarization insulating film 940 may be formed by stacking a plurality of insulating films formed from these materials.

There is no particular limitation on the method for forming the planarization insulating film 940, and a sputtering method, spin coating, dipping, spray coating, a droplet discharge method (such as an inkjet method), screen printing, offset printing, or the like can be used depending on the material.

As a planarization insulating film, an organic resin film such as an acrylic film is generally used. However, the organic resin film contains more water than an inorganic insulating film; thus, water in the outside easily penetrates the organic resin film. Thus, in the case where an organic resin film such as an acrylic film is used as the planarization insulating film 940, there is a possibility that water causes a change in electrical characteristics of the transistor included in the liquid crystal display device and accordingly, the reliability of the liquid crystal display device is lowered.

Thus, as illustrated in the liquid crystal display device in FIGS. 5A and 5B, it is preferable to provide an insulating film 942 which has a function of suppressing entry of water over the planarization insulating film 940. For example, as the insulating film 942, a nitride insulating film such as a silicon nitride film can be used, and a nitride insulating film which can be used as the insulating film 26 of the transistors 50 and 70 can be used.

The insulating film 932 corresponds to the protective film 27; thus, the outermost surface of the insulating film 932 is formed using a nitride insulating film such as a silicon nitride film. An organic resin film has a higher adhesiveness with a nitride insulating film than with an oxide insulating film; thus, the adhesiveness between the planarization insulating film 940 and the insulating film 932 is high. Thus, a change in electrical characteristics of the transistor included in the liquid crystal display device is suppressed and the reliability of the liquid crystal display device can be improved.

Further, as illustrated in FIGS. 5A and 5B, the planarization insulating film 940 positioned near to the sealant 905 (especially an end portion of the planarization insulating film 940) may be covered with (or sandwiched between) the insulating film 932 and the insulating film 942. In other words, the planarization insulating film 940 may be covered with a nitride insulating film.

Figure 6:
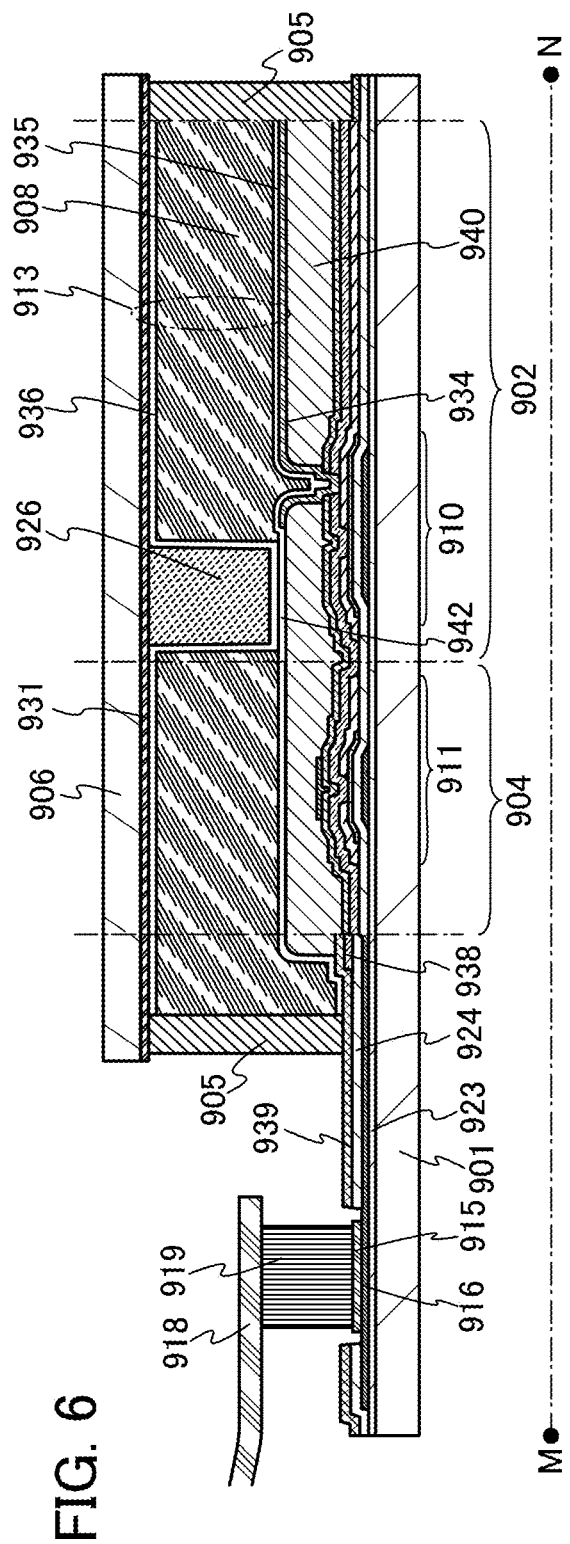
FIG. 6 is a cross-sectional view illustrating one embodiment of a display device.

The structure of the liquid crystal display device of one embodiment of the present invention is not limited to the structures illustrated in FIGS. 5A and 5B. For example, the following structure which is illustrated in FIG. 6 may be employed: the insulating film 942 is not provided, an insulating film 938 (corresponding to the insulating films 23 to 25 in FIGS. 1A to 1C and FIG. 3) and an insulating film 939 (corresponding to the insulating film 26 in FIGS. 1A to 1C and FIG. 3) which function as the insulating film 932 in FIGS. 5A and 5B are separately formed, and only the insulating film 939 which suppresses entry of water is positioned below the sealant 905. The structure can be formed by, after the insulating film 938 is formed so that an end portion of the insulating film 938 is positioned on the inner side than the sealant 905, forming the insulating film 939 over the insulating film 938 and forming the planarization insulating film 940 and an alignment film 935 over the insulating film 939. The structure in which an insulating film which suppresses entry of water is provided below a sealant can be applied to not only a liquid crystal display device but also the display device of one embodiment of the present invention such as a light-emitting device described below.

In such a manner, even in the case where an organic resin film such as an acrylic film is used as the planarization insulating film 940, entry of water can be suppressed, a change in electrical characteristics of the transistor included in the liquid crystal display device is suppressed, and the reliability of the liquid crystal display device can be improved.

In each of the liquid crystal display devices in FIGS. 5A and 5B, a liquid crystal element 913 includes the pixel electrode 934, a counter electrode (also referred to as a common electrode) 931, and a liquid crystal 908, and the alignment film 935 and an alignment film 936 are provided to sandwich the liquid crystal 908. A space surrounded by the substrates 901 and 906 and the sealant 905 is filled with the liquid crystal 908. The bonding surface of the sealant 905 on the substrate 906 side is provided with the counter electrode 931 (see FIG. 5A); however, the sealant 905 may be bonded directly to the substrate 906 (see FIG. 5B). An alignment film may be provided on the bonding surface of the sealant 905. An alignment film has an uneven surface caused by rubbing treatment; thus, an anchor effect is caused and adhesiveness of the sealant 905 is improved, so that the reliability of the liquid crystal display device can be improved.

In the liquid crystal display device illustrated in FIG. 5A, the counter electrode 931 is provided over the substrate 906, a spacer 926 is provided over the counter electrode 931, and the alignment film 936 is provided to cover the spacer 926 and the counter electrode 931. Thus, in the liquid crystal element 913 of the liquid crystal display device illustrated in FIG. 5A, the counter electrode 931 is stacked over the pixel electrode 934 with the alignment film 935, the liquid crystal 908, and the alignment film 936 provided therebetween.

In the liquid crystal display device illustrated in FIG. 5B, the spacer 926 is provided over the substrate 906, and the alignment film 936 is provided to cover the spacer 926. An insulating film 943 is provided over the pixel electrode 934, the counter electrode 931 having an opening pattern is provided over the insulating film 943, and the alignment film 935 is provided to cover the counter electrode 931. The opening pattern of the counter electrode 931 includes a bent portion or a branched comb-shaped portion. In order to generate an electric field between the pixel electrode 934 and the counter electrode 931, the pixel electrode 934 and the counter electrode 931 are positioned so as to have a portion in which they do not overlap with each other. Thus, in the liquid crystal element 913 of the liquid crystal display device illustrated in FIG. 5B, the pixel electrode 934 and the counter electrode 931 are provided below the liquid crystal 908. Alternatively, the pixel electrode 934 may have the opening pattern and the counter electrode 931 may have a plate-like shape.

In each of the liquid crystal display devices in FIGS. 5A and 5B, the sealant 905 on the substrate 901 side is provided with at least an insulating film 923, the terminal electrode 916, an insulating film 924, and the insulating film 942. The insulating film 923 corresponds to a base insulating film of the transistors 910 and 911 (the base insulating film 13 of the transistors 50 and 70). The insulating film 924 corresponds to a gate insulating film of the transistors 910 and 911 (the gate insulating film 18 of the transistors 50 and 70). For the terminal electrode 916 and the insulating film 942, the above description can be referred to.

The pixel electrode 934 and the counter electrode 931 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the pixel electrode 934 and the counter electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The pixel electrode 934 and the counter electrode 931 can be formed using a conductive composition including a conductive macromolecule (also referred to as a conductive polymer). The conductive macromolecule, known as a π-electron conjugated conductive macromolecule, can be used. Polyaniline or a derivative thereof, polypyrrole or a derivative thereof, polythiophene or a derivative thereof, a copolymer of two or more of aniline, pyrrole, and thiophene or a derivative thereof can be given as examples.

The sealant 905 can be formed over the substrate 901 or the substrate 906 using a screen printing method, an ink-jet apparatus, or a dispensing apparatus. As the sealant 905, typically, a material containing a visible light curable resin, an ultraviolet curable resin, or a thermosetting resin can be used. Note that it is preferable to select a sealing material which is insoluble in the liquid crystal 908 for the sealant 905. The sealant 905 may contain conductive particles in order to provide a common connection portion (pad portion) below the sealant 905.

Further, the spacer 926 is a columnar spacer obtained by selective etching of an insulating film and is provided in order to control the distance between the substrate 901 and the substrate 906 (a cell gap). Alternatively, a spherical spacer may be used for the spacer 926.

For the liquid crystal 908, a thermotropic liquid crystal, a liquid crystal material such as a ferroelectric liquid crystal, an anti-ferroelectric liquid crystal, or the like can be used. The liquid crystal material may be a low-molecular liquid crystal or a high-molecular liquid crystal. Such a liquid crystal material (liquid crystal composition) exhibits a cholesteric phase, a smectic phase, a cubic phase, a chiral nematic phase, an isotropic phase, or the like depending on a condition.

Alternatively, a liquid crystal composition exhibiting a blue phase for which an alignment film is unnecessary may be used for the liquid crystal 908. In this case, the liquid crystal 908 is in contact with the pixel electrode 934 and the counter electrode 931. A blue phase is one of liquid crystal phases, which is generated just before a cholesteric phase changes into an isotropic phase while temperature of cholesteric liquid crystal is raised. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using the transistor including the oxide semiconductor film disclosed in this specification, it is enough to provide a storage capacitor having a capacitance that is 1/3 or less, preferably 1/5 or less of a liquid crystal capacitance of each pixel.

Since the transistor of one embodiment of the present invention includes an oxide semiconductor, the current in an off state (off-state current) can be controlled to be small. Accordingly, an electric signal such as an image signal can be held for a longer period, and a writing interval can be set longer. Accordingly, the frequency of refresh operation can be reduced, which leads to an effect of suppressing power consumption. A storage capacitor can be formed using a conductive film which is formed in the formation step of the pixel electrode 934 as one electrode, an insulating film (the insulating film 943 in FIG. 5B) over the pixel electrode 934 as a dielectric, and another conductive film as the other electrode.

Further, the transistor of one embodiment of the present invention can have high field-effect mobility and thus can be driven at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device in this embodiment, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, and the like can be used.

The liquid crystal display device described in this embodiment may be a normally black liquid crystal display device such as a transmissive liquid crystal display device utilizing a vertical alignment (VA) mode. Some examples are given as the vertical alignment mode. For example, a multi-domain vertical alignment (MVA) mode, a patterned vertical alignment (PVA) mode, an Advanced Super View (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

A black matrix (a light-blocking layer); an optical member (an optical substrate) such as a polarizing member, a retardation member, or an anti-reflection member; or the like can be provided as appropriate to the liquid crystal display device of this embodiment. For example, circular polarization may be obtained by using a polarizing substrate and a retardation substrate. Although not illustrated, a backlight, a sidelight, or the like can be used as a light source.

As a display method in the pixel portion, a progressive method, an interlace method, or the like can be employed. Note that the liquid crystal display device of one embodiment of the present invention is not limited to the application to a display device for monochrome display, and can also be applied to a display device for color display. For example, by providing a color filter between the counter electrode 931 and the alignment film 936, the liquid crystal display device becomes capable of color display. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements.

As the color filter, for example, a chromatic light-transmitting resin can be used. As the chromatic color light-transmitting resin, a photosensitive organic resin or a non-photosensitive organic resin can be used. A photosensitive organic resin layer is preferably used because the number of resist masks can be reduced, leading to simplification of a process.

Chromatic colors are colors except achromatic colors such as black, gray, and white. A color filter is formed using a material which transmits only light of a chromatic color which the material is colored in. As chromatic color, red, green, blue, or the like can be used. Alternatively, cyan, magenta, yellow, or the like may also be used. "Transmitting only light of a chromatic color" means that light passing through the color filter layer has a peak at a wavelength of the light of the chromatic color. The thickness of the color filter layer may be controlled as appropriate in consideration of the relationship between the concentration of the coloring material to be included and the transmittance of light. For example, the color filter may have a thickness greater than or equal to 1500 nm and less than or equal to 2000 nm.

Figure 7A:
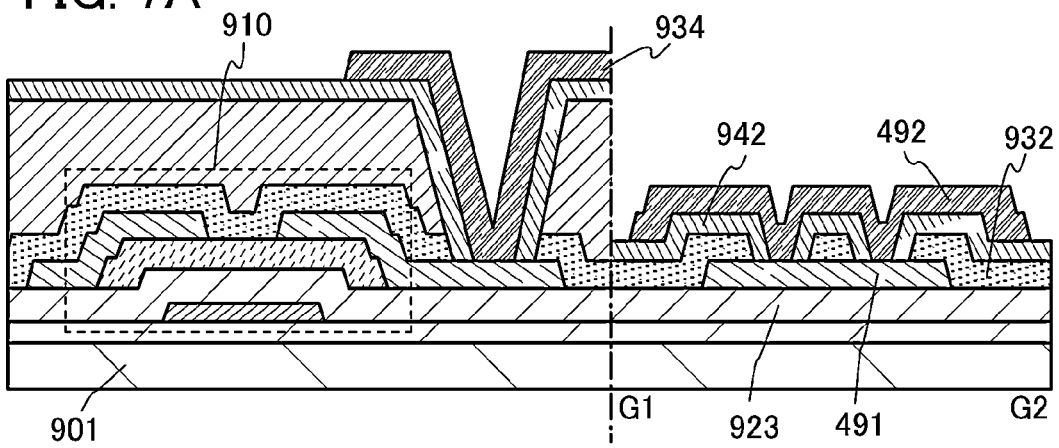
FIGS. 7A to 7C are a top view and cross-sectional views illustrating one embodiment of a display device.
Figure 7B:
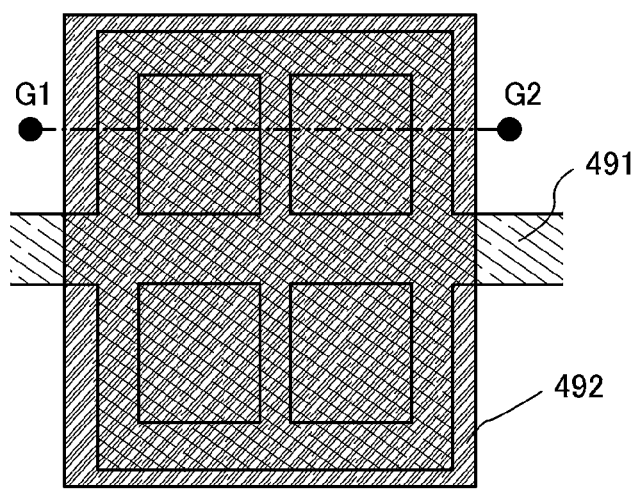
Figure 7C:
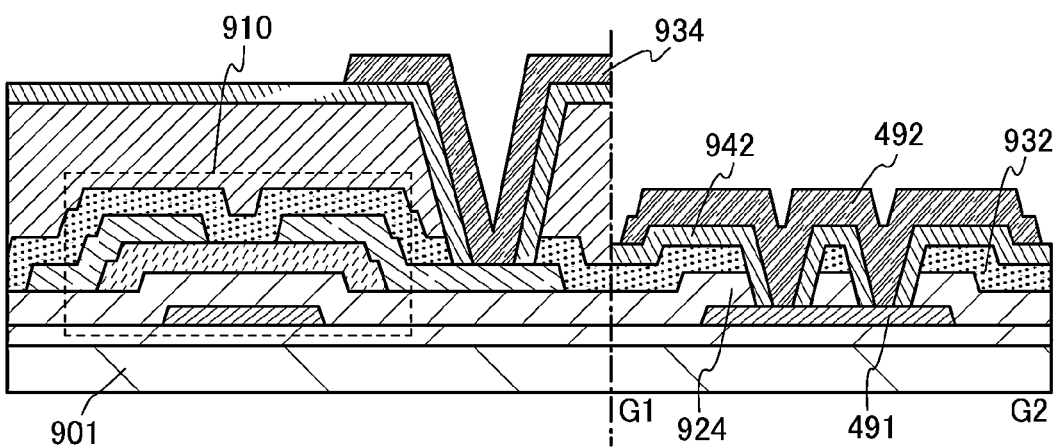

FIGS. 7A to 7C illustrate an example of the display device in FIGS. 5A and 5B in which a common connection portion (pad portion) for electrically connecting to the counter electrode 931 provided on the substrate 906 is formed over the substrate 901.

Note that the contact hole in the pixel portion and the openings in the common connection portion are distinctively described because their sizes differ considerably. In FIGS. 5A and 5B and FIGS. 7A to 7C, the pixel portion 902 and the common connection portion are not illustrated on the same scale. For example, the length of the chain line G1-G2 in the common connection portion is about 500 μm, whereas the size of the transistor of the pixel portion 902 is less than 50 μm; thus, the area of the common connection portion is ten times or more as large as that of the transistor. However, the scales of the pixel portion 902 and the common connection portion are changed in FIGS. 5A and 5B and FIGS. 7A to 7C for simplification.

The common connection portion is provided in a position that overlaps with the sealant 905 for bonding the substrate 901 and the substrate 906, and is electrically connected to the counter electrode 931 through conductive particles contained in the sealant 905. Alternatively, the common connection portion is provided in a position that does not overlap with the sealant 905 (except for the pixel portion) and a paste containing conductive particles is provided separately from the sealant so as to overlap with the common connection portion, whereby the common connection portion is electrically connected to the counter electrode 931.

As the conductive particle, a conductive particle in which an insulating sphere is covered with a thin metal film can be used. The insulating sphere is formed using silica glass, hard resin, or the like. The thin metal film can be formed to have a single-layer structure or a stacked-layer structure using one or more of gold, silver, palladium, nickel, indium tin oxide, and indium zinc oxide. For example, as each metal thin film, a gold thin film, a stack of a nickel thin film and a gold thin film, or the like can be used. By using a conductive particle in which the insulating sphere is contained at the center, elasticity can be improved so that destruction due to external pressure can be reduced.

The space around the conductive particles may be filled with a conductive polymer instead of an organic resin insulating material. As typical examples of the conductive polymer, conductive polyaniline, conductive polypyrrole, conductive polythiophene, a complex of polyethylenedioxythiophene (PEDOT) and poly(styrenesulfonic acid) (PSS), and the like can be given. Further, any of the afore-mentioned examples of the conductive polymer which can be used for the pixel electrode 934 can be used as appropriate, as well. The conductive polymer is formed by applying the conductive polymer with an inkjet apparatus, a dispensing apparatus, or the like. That is, the conductive polymer is in contact with the counter electrode or the connection wiring, whereby the conductive particle and the conductive polymer are in contact with the counter electrode or the connection wiring, so that connection resistance between the counter electrode and the connection wiring can be reduced.

In the case where the sealant 905 contains conductive particles, the pair of substrates is aligned so that the sealant 905 overlaps with the common connection portion. For example, in a small-sized liquid crystal panel, two common connection portions are arranged so as to overlap with the sealant at opposite corners of the pixel portion 902 and the like. In the case of a large liquid crystal panel, four or more common connection portions overlap with the sealant.

FIG. 7A is a cross-sectional view of the common connection portion taken along a line G1-G2 in the top view in FIG. 7B.

A common potential line 491 is provided over the insulating film 923 (the gate insulating film of the transistor 910), and is formed using the conductive film which is formed in the formation step of a source electrode and a drain electrode of the transistors 910 and 911 in FIGS. 5A and 5B. FIG. 7A illustrates an example in which the insulating film which is formed in the formation step of the source electrode and the drain electrode of the transistor 910 is used for the common potential line 491.

The insulating film 932, the insulating film 942, and a common electrode 492 are provided over the common potential line 491. The insulating films 932 and 942 have a plurality of openings in positions which overlap with the common potential line 491, and the common electrode 492 is in contact with the common potential line 491 through the openings. The openings are formed in the same step as the contact hole which connects one of the source electrode and the drain electrode of the transistor 910 to the pixel electrode 934. Thus, the insulating film 942 is provided in contact with side surfaces of the insulating film 932 in the openings.

The common electrode 492 is provided over the insulating film 942, and is formed using the conductive film which is formed in the formation step of the connection terminal electrode 915 and the pixel electrode 934 in the pixel portion.

In this manner, the common connection portion can be formed in the same process as the switching element in the pixel portion 902.

Note that the common electrode 492 is an electrode in contact with the conductive particles contained in the sealant 905, and is electrically connected to the counter electrode 931 of the substrate 906.

Further, as illustrated in FIG. 7C, the common potential line 491 in the common connection portion may be formed using a conductive film which is formed in the formation step of the gate electrodes of the transistors 910 and 911. FIG. 7C illustrates an example in which the insulating film which is formed in the formation step of the gate electrode of the transistor 910 is used for the common potential line 491.

The insulating film 924, the insulating film 932, the insulating film 942, and the common electrode 492 are provided over the common potential line 491. The insulating films 924, 932, and 942 have a plurality of openings in positions which overlap with the common potential line 491, and the common electrode 492 is in contact with the common potential line 491 through the openings. The openings are formed in the same step as the contact hole which connects one of the source electrode and the drain electrode of the transistor 910 to the pixel electrode 934. Thus, the insulating film 942 is provided in contact with side surfaces of the insulating films 924 and 932 in the openings.

Further, as the display element included in the display device of one embodiment of the present invention, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by applying voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as the light-emitting element is described.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

Figure 8:
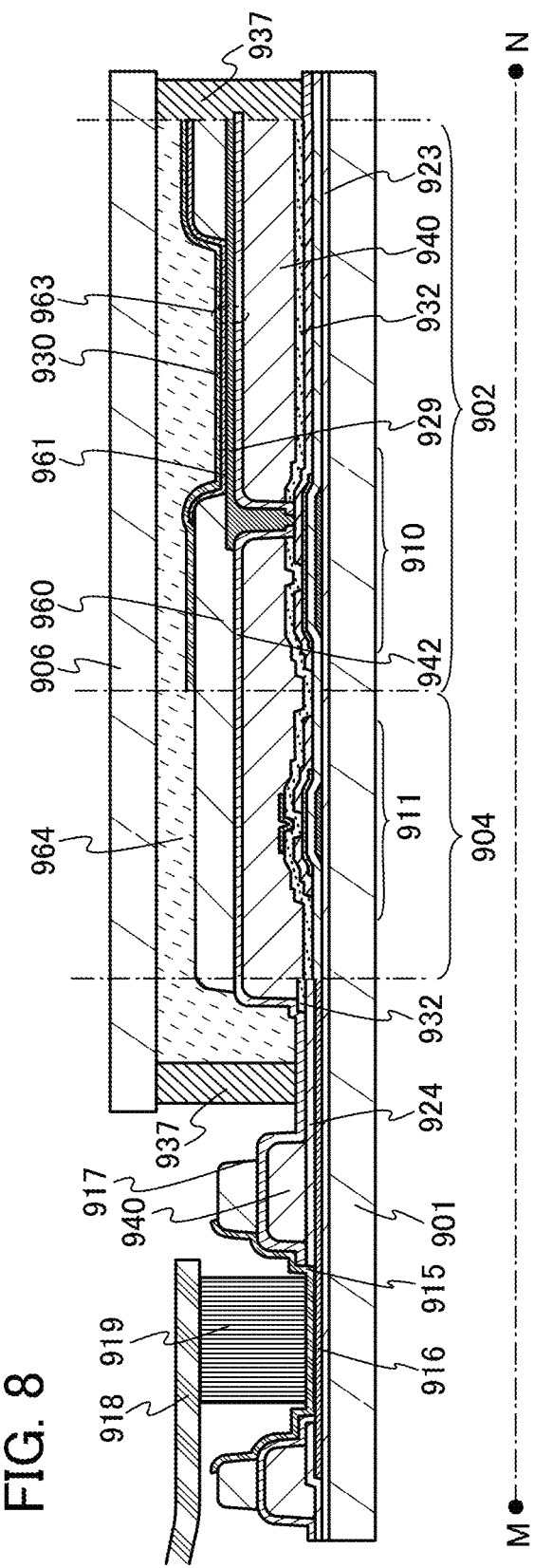
FIG. 8 is a cross-sectional view illustrating one embodiment of a display device.

An example of a light-emitting device using a light-emitting element as the display element is shown in FIG. 8. FIG. 8 corresponds to a cross-sectional view taken along line M-N in FIG. 4B. Note that for the light-emitting device illustrated in FIG. 8, the reference numerals used for the light-emitting devices illustrated in FIGS. 5A and 5B are used as appropriate.

A light-emitting element 963 which is a display element is electrically connected to the transistor 910 provided in the pixel portion 902. Note that although the structure of the light-emitting element 963 is a stacked-layer structure of a first electrode 929, a light-emitting layer 961, and a second electrode 930, the structure is not limited thereto. The structure of the light-emitting element 963 can be changed as appropriate depending on the direction in which light is extracted from the light-emitting element 963, or the like.

In the light-emitting device illustrated in FIG. 8, as in the liquid crystal display device in FIGS. 5A and 5B, the planarization insulating film 940 is preferably provided over the transistors 910 and 911. Further, the insulating film 942 is preferably provided over the planarization insulating film 940. Further, the planarization insulating film 940 positioned near to a sealant 937 (especially the end portion of the planarization insulating film 940) may be covered with (or sandwiched between) the insulating film 932 and the insulating film 942. By providing the insulating film 942, even in the case where an organic resin film such as an acrylic film is used as the planarization insulating film 940, entry of water can be suppressed, a change in electrical characteristics of the transistor included in the light-emitting device is suppressed, and the reliability of the light-emitting device can be improved.

A partition wall 960 can be formed using an organic insulating material or an inorganic insulating material. It is particularly preferred that the partition wall 960 be formed using a photosensitive resin material to have an opening over the first electrode 929 so that a sidewall of the opening has an inclined surface with a continuous curvature.

The light-emitting layer 961 may be formed to have a single-layer structure or a stacked-layer structure including a plurality of layers.

A protective film may be formed over the second electrode 930 and the partition wall 960 in order to prevent oxygen, hydrogen, moisture, carbon dioxide, or the like from entering the light-emitting element 963. As the protective film, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is sealed with the substrate 901, the substrate 906, and the sealant 937, a filler 964 is provided and sealed. It is preferable that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 937, fritted glass including low-melting glass or the like can be used as well as the sealant 905 which can be used for the liquid crystal display devices illustrated in FIGS. 5A and 5B. The fitted glass is preferred because of its high barrier property against impurities such as water and oxygen. When the fritted glass is used for the sealant 937, the fritted glass is preferably provided over the insulating film 942 as illustrated in FIG. 8. Since the insulating film 942 is an inorganic insulating film such as a silicon nitride film, the insulating film 942 can have higher adhesion to the fritted glass.

As the filler 964, as well as an inert gas such as nitrogen or argon, an ultraviolet curable resin or a thermosetting resin can be used: polyvinyl chloride (PVC), an acrylic resin, polyamide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which are also referred to as a pixel electrode, a common electrode, a counter electrode, or the like) for applying voltage to the display element can have light-transmitting properties or light-reflecting properties, which depends on the direction in which light is extracted, the position where the electrodes are provided, and the pattern structure of the electrodes.

For the first electrode 929 and the second electrode 930, conductive materials which can be used for the pixel electrode 934 and the counter electrode 931 of the liquid crystal display devices illustrated in FIGS. 5A and 5B can be used. For the first electrode 929 and the second electrode 930, one or more selected from a metal which can be used for the pixel electrode 934 and the counter electrode 931 of the liquid crystal display devices illustrated in FIGS. 5A and 5B, an alloy thereof, and a metal nitride thereof can also be used. For the first electrode 929 and the second electrode 930, a conductive composition containing a conductive polymer which can be used for the pixel electrode 934 and the counter electrode 931 of the liquid crystal display devices illustrated in FIGS. 5A and 5B can also be used.

Other components such as the substrate 901, the substrate 906, the transistor 910, the transistor 911, the connection terminal electrode 915, the terminal electrode 916, the FPC 918, the anisotropic conductive film 919, the insulating film 923, the insulating film 924, and the insulating film 932 are similar to those in the liquid crystal display devices illustrated in FIGS. 5A and 5B. Thus, a change in electrical characteristics of the transistor included in the light-emitting device is suppressed, and the reliability of the light-emitting device can be improved.

Since the transistor is easily broken owing to static electricity or the like, a protective circuit for protecting the driver circuit is preferably provided. The protection circuit is preferably formed using a nonlinear element.

A red light-emitting element, a green light-emitting element, and a blue light-emitting element are stacked to form white light-emitting element, and a color filter is used, whereby the light-emitting device of one embodiment of the present invention can perform color display. Further, in the case where the red light-emitting element, the green light-emitting element, and the blue light-emitting element are separately formed, the light-emitting device of one embodiment of the present invention can perform color display without using a color filter or the like.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

A dispersion of the above microcapsules in a solvent is referred to as electronic ink. This electronic ink can be printed on a surface of glass, plastic, cloth, paper, or the like. Furthermore, by the use of a color filter or particles that have a pigment, color display is also possible.

Note that the first particles and the second particles in the microcapsules may be formed from one of a conductive material, an insulating material, a semiconductor material, a magnetic material, a liquid crystal material, a ferroelectric material, an electroluminescent material, an electrochromic material, and a magnetophoretic material or a composite material of any of these materials.

As the electronic paper, a display device using a twisting ball display system can be used. In the twisting ball display system, spherical particles each colored in black and white are arranged between a first electrode (e.g., a pixel electrode) and a second electrode (e.g., a common electrode) which are electrodes used for a display element, and a potential difference is generated between the first electrode and the second electrode to control orientation of the spherical particles, so that display is performed.

The structure, method, and the like described in this embodiment can be used in combination with structures, methods, and the like described in other embodiments and examples, as appropriate.

Embodiment 4

A semiconductor device having an image sensor function for reading data of an object can be manufactured with the use of a transistor of one embodiment of the present invention. In this embodiment, the semiconductor device having an image sensor function is described.

Figure 9A:
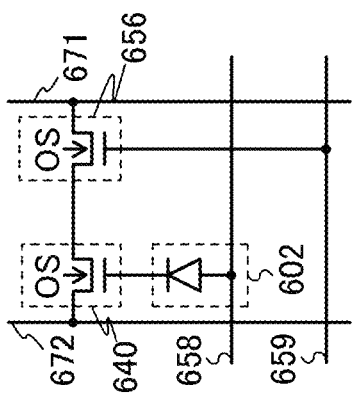
FIGS. 9A and 9B are a circuit diagram and a cross-sectional view illustrating one embodiment of a semiconductor device.

An example of a semiconductor device having an image sensor function is illustrated in FIG. 9A. FIG. 9A illustrates an equivalent circuit of a photo sensor, and FIG. 9B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor film is denoted by a symbol "OS" so that it can be identified as a transistor including an oxide semiconductor film. In FIG. 9A, the transistor 640 and the transistor 656 are transistors each using an oxide semiconductor, to which any of the transistors of one embodiment of the present invention can be applied.

Figure 9B:
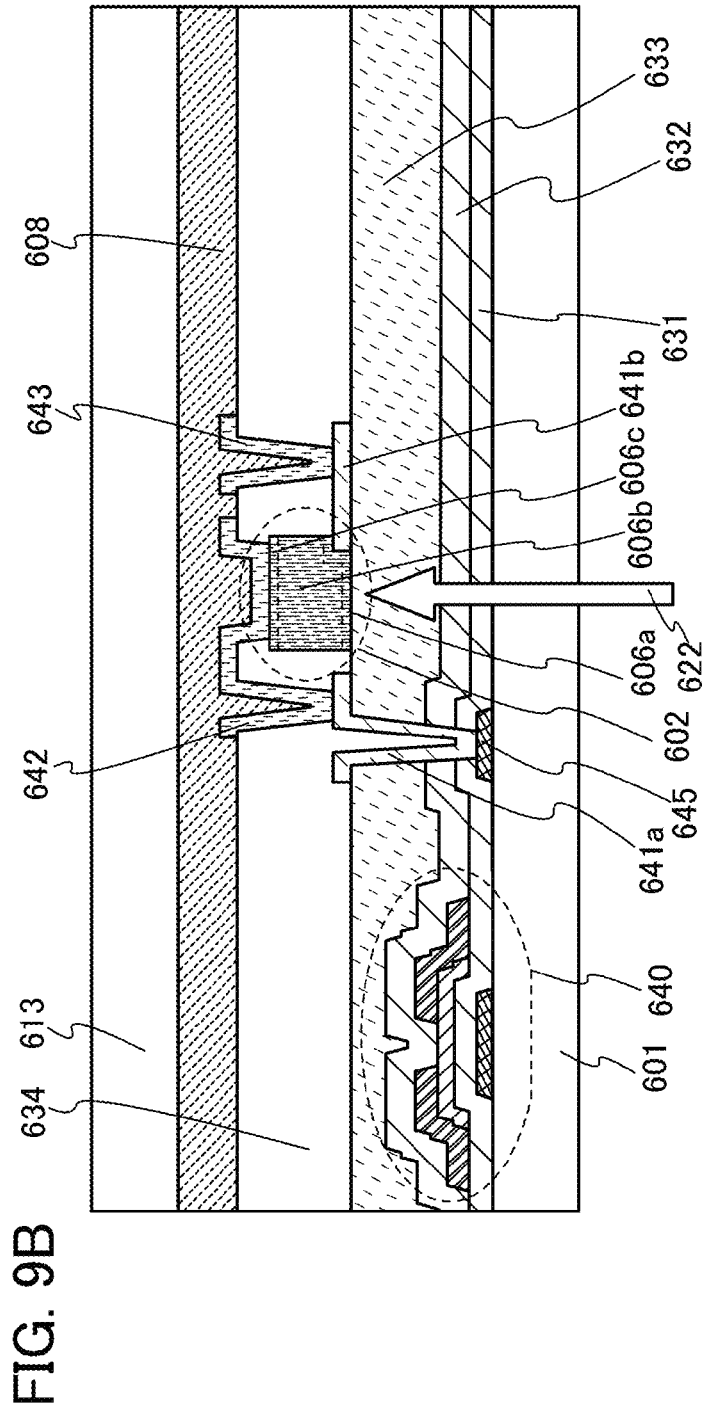

FIG. 9B is a cross-sectional view of the photodiode 602 and the transistor 640 in the photosensor. The transistor 640 and the photodiode 602 functioning as a sensor are provided over a substrate 601 (an element substrate) having an insulating surface. A substrate 613 is provided over the photodiode 602 and the transistor 640 with an adhesive layer 608 interposed therebetween.

An insulating film 632, an interlayer insulating film 633, and an interlayer insulating film 634 are provided over the transistor 640. The photodiode 602 includes an electrode layer 641b formed over the interlayer insulating film 633; a first semiconductor film 606a, a second semiconductor film 606b, and a third semiconductor film 606c over the electrode layer 641b in this order; an electrode layer 642 which is provided over the interlayer insulating film 634 and electrically connected to the electrode layer 641b through the first to third semiconductor films; and an electrode layer 641a which is provided in the same layer as the electrode layer 641b and electrically connected to the electrode layer 642.

The insulating film 632 suppresses entry of water into the transistor 640, and include an insulating film containing at least nitrogen (corresponding to the insulating film 26 in FIGS. 1A to 1C) and an insulating film which suppresses entry of nitrogen released from the insulating film (corresponding to the insulating film 25 in FIGS. 1A to 1C).

The electrode layer 641b is electrically connected to a conductive layer 643 formed over the interlayer insulating film 634, and the electrode layer 642 is electrically connected to a conductive film 645 through the electrode layer 641a. The conductive film 645 is electrically connected to a gate electrode of the transistor 640, and thus the photodiode 602 is electrically connected to the transistor 640.

Here, a pin photodiode in which a semiconductor film having p-type conductivity type as the first semiconductor film 606a, a high-resistance semiconductor film (i-type semiconductor film) as the second semiconductor film 606b, and a semiconductor film having n-type conductivity type as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The first semiconductor film 606a is preferably formed to a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor material gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor material gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion implantation method or the like in order to diffuse the impurity element. In that case, as a method of forming the amorphous silicon film, an LPCVD method, a chemical vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

In addition, the mobility of holes generated by the photoelectric effect is lower than the mobility of electrons. Therefore, a PIN photodiode has better characteristics when a surface on the p-type semiconductor film side is used as a light-receiving plane.

Here, an example in which light received by the photodiode 602 from a surface of the substrate 601, over which the pin photodiode is formed, is converted into electric signals is described. Light from the semiconductor film having a conductivity type opposite to that of the semiconductor film on the light-receiving plane is disturbance light; therefore, the electrode is preferably formed using a light-blocking conductive film. Note that the n-type semiconductor film side may alternatively be a light-receiving plane.

The transistor 640 includes an insulating film which suppresses entry of water and contains at least nitrogen and an insulating film which suppresses entry of nitrogen released from the insulating film over the oxide semiconductor film functioning as a current path (channel); thus, a change in electrical characteristics of the transistor can be suppressed, and the reliability of the transistor is high.

The insulating film 632 can be formed by a method which can be applied to the protective film 27 of the transistor 50 described in Embodiment 1.

The interlayer insulating film 633 and the interlayer insulating film 634 can be formed using an insulating material by a sputtering method, a plasma CVD method, spin coating, dipping, spray coating, a droplet discharge method (such as an inkjet method), screen printing, offset printing, or the like depending on the material.

For a reduction in surface roughness, an insulating film functioning as a planarization insulating film is preferably used as each of the interlayer insulating films 633 and 634. For the interlayer insulating films 633 and 634, a single layer or a stacked layer of the above metal materials which can be used for the planarization insulating film 940 can be used.

With detection of light that enters the photodiode 602, data on an object to be detected can be read. Note that a light source such as a backlight can be used at the time of reading information on an object. A touch panel can be manufactured by stacking the semiconductor device having an image sensor function over a display device of one embodiment of the present invention.

The structure, method, and the like described in this embodiment can be used in combination with structures, methods, and the like described in other embodiments and examples, as appropriate.

Embodiment 5

A semiconductor device of one embodiment of the present invention can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are illustrated in FIGS. 10A to 10C.

Figure 10A:
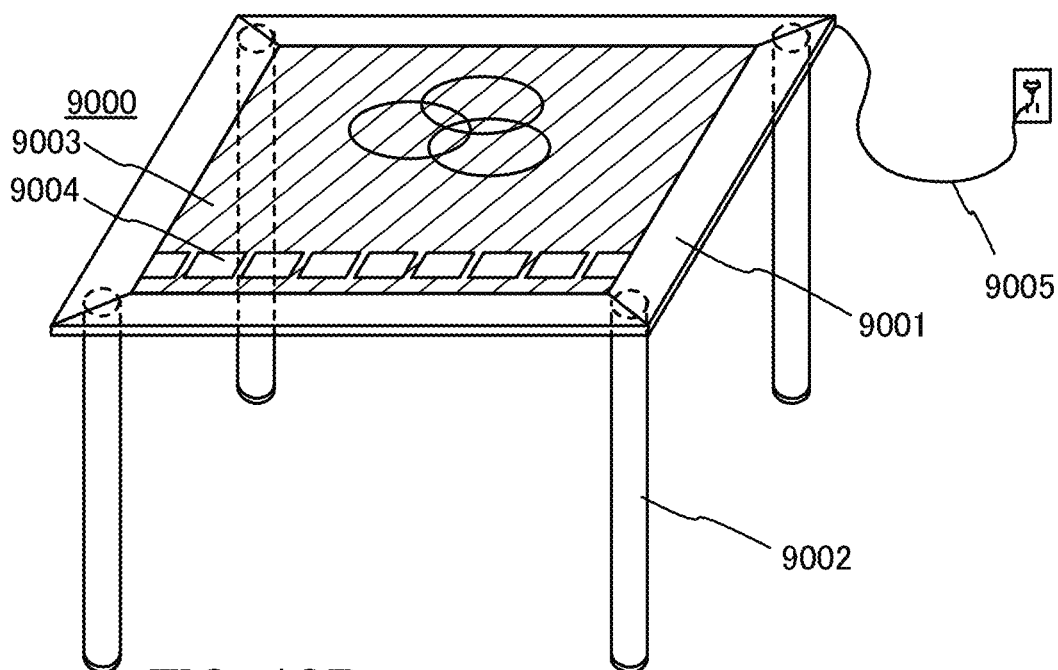
FIGS. 10A to 10C each illustrate an electronic device.
Figure 10B:
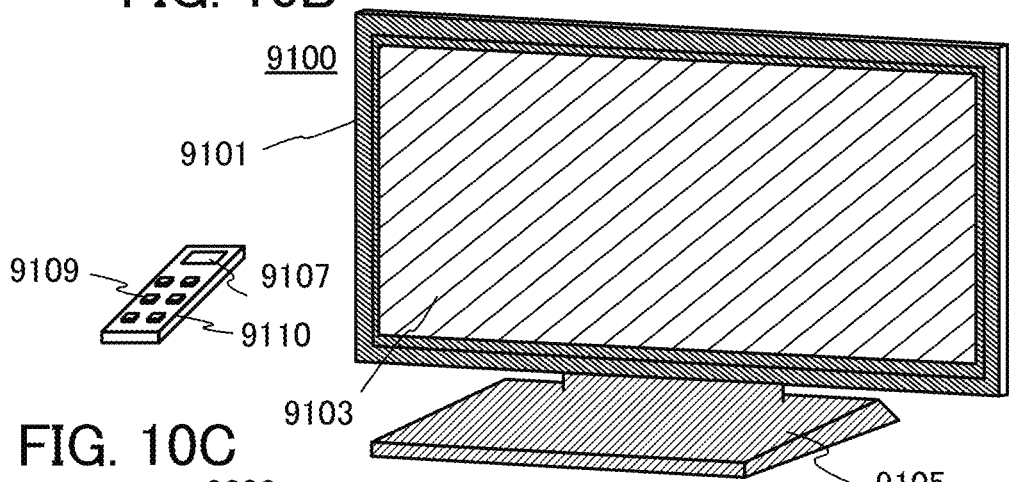
Figure 10C:
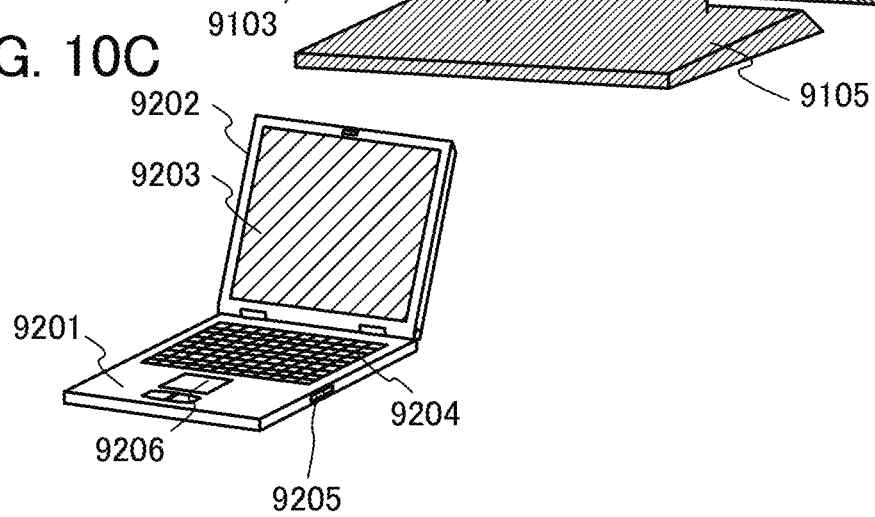

FIG. 10A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used for the display portion 9003, so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 10B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 10B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107, so that the television set and the remote controller can have high reliability.

FIG. 10C illustrates a computer, which includes a main body 9201, a housing 9202, a display portion 9203, a keyboard 9204, an external connection port 9205, a pointing device 9206, and the like.

The semiconductor device described in any of the above embodiments can be used for the display portion 9203, so that the computer can have high reliability.

FIGS. 11A and 11B illustrate a tablet terminal that can be folded. In FIG. 11A, the tablet terminal is opened, and includes a housing 9630, a display portion 9631*a*, a display portion 9631*b*, a display-mode switching button 9034, a power button 9035, a power-saving-mode switching button 9036, a clip 9033, and an operation button 9038.

The semiconductor device described in any of the above embodiments can be used for the display portion 9631*a* and the display portion 9631*b*, so that the tablet terminal can have high reliability.

Part of the display portion 9631*a* can be a touch panel region 9632*a*, and data can be input by touching operation keys 9638 that are displayed. Note that FIG. 10A shows, as an example, that half of the area of the display portion 9631*a* has only a display function and the other half of the area has a touch panel function. However, the structure of the display portion 9631*a* is not limited to this, and all the area of the display portion 9631*a* may have a touch panel function. For example, all the area of the display portion 9631*a* can display keyboard buttons and serve as a touch panel while the display portion 9631*b* can be used as a display screen.

In the display portion 9631*b*, as in the display portion 9631*a*, part of the display portion 9631*b* can be a touch panel region 9632*b*. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036 for switching to power-saving mode, the luminance of display can be optimized in accordance with the amount of external light at the time when the tablet is in use, which is detected with an optical sensor incorporated in the tablet. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 11A, one embodiment of the present invention is not limited to this example. The display portion 9631a and the display portion 9631b may have different areas or different display quality. For example, one of them may be a display panel that can display higher-definition images than the other.

FIG. 11B illustrates the tablet terminal folded, which includes the housing 9630, a solar battery 9633, and a charge and discharge control circuit 9634. Note that FIG. 11B shows an example in which the charge and discharge control circuit 9634 includes a battery 9635 and a DCDC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 11A and 11B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or two surfaces of the housing 9630, so that the battery 9635 can be charged efficiently. When a lithium ion battery is used as the battery 9635, there is an advantage of downsizing or the like.

The structure and operation of the charge and discharge control circuit 9634 illustrated in FIG. 11B are described with reference to a block diagram of FIG. 11C. The solar battery 9633, the battery 9635, the DCDC converter 9636, a converter 9637, switches SW1 to SW3, and the display portion 9631 are illustrated in FIG. 11C, and the battery 9635, the DCDC converter 9636, the converter 9637, and the switches SW1 to SW3 correspond to the charge and discharge control circuit 9634 illustrated in FIG. 11B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

The structure, method, and the like described in this embodiment can be used in combination with structures, methods, and the like described in other embodiments and examples, as appropriate.

Example 1

In this example, results of evaluating an insulating film which suppresses entry of water and can be used for the transistor of one embodiment of the present invention are described. In detail, results of evaluating the amounts of hydrogen molecules, ammonia molecules, and water molecules which are released by heating are described.

First, a method for forming the evaluated samples is described. The formed samples each have a structure 1 or a structure 2.

Figure 12A:
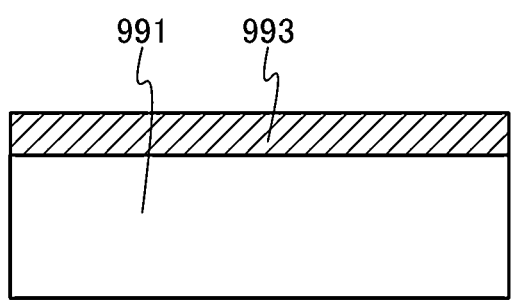
FIGS. 12A and 12B illustrate structures of samples.

A silicon nitride film 993 was formed over a silicon wafer 991 by a plasma CVD method using formation conditions which can be used for the insulating film 26 described in Embodiment 1 (see FIGS. 1A to 1C), so that the sample having the structure 1 was formed (see FIG. 12A).

The silicon nitride film 993 was formed using three conditions which are a condition 1, a condition 2, and a condition 3. The sample formed using the condition 1 is referred to as a sample A1. The sample formed using the condition 2 is referred to as a sample A2. The sample formed using condition 3 is referred to as a sample A3. The samples A1 to A3 each has the silicon nitride film 993 with a thickness of 50 nm.

The condition 1 was as follows: the temperature of the silicon wafer 991 was 220° C.; the source gas was silane, nitrogen, and ammonia with a flow rate of 50 sccm, 5000 sccm, and 100 sccm, respectively; the pressure of the treatment chamber was 200 Pa; and the high-frequency power supplied to parallel plate electrodes was 27.12 MHz and 1000 W (the power density was $1.6 \times 10^{-1}$ W/cm$^2$). The flow ratio of nitrogen to ammonia was 50.

The condition 2 was the same as the condition 1 except that the high-frequency power supplied to parallel plate electrodes was 150 W (the power density was $2.5 \times 10^{-2}$ W/cm$^2$).

The condition 3 was as follows: the temperature of the silicon wafer 991 was 220° C.; the source gas was silane, nitrogen, and ammonia with a flow rate of 30 sccm, 1500 sccm, and 1500 sccm, respectively; the pressure of the treatment chamber was 200 Pa; and the high-frequency power supplied to parallel plate electrodes was 27.12 MHz and 150 W (the power density was $2.5 \times 10^{-2}$ W/cm$^2$). The flow ratio of nitrogen to ammonia was 1.

TDS analyses were performed on the samples A1 to A3. In each of the samples, the silicon wafer 991 was heated at 65° C. or higher and 610° C. or lower.

The peaks of the curves shown in the results obtained from TDS appear due to release of atoms or molecules contained in the analyzed samples (in this example, the samples A1 to A3) to the outside. The total number of the atoms or molecules released to the outside corresponds to the integral value of the peak. Thus, with the degree of the peak intensity, the number of the atoms or molecules contained in the silicon nitride film can be evaluated.

Figure 13A:
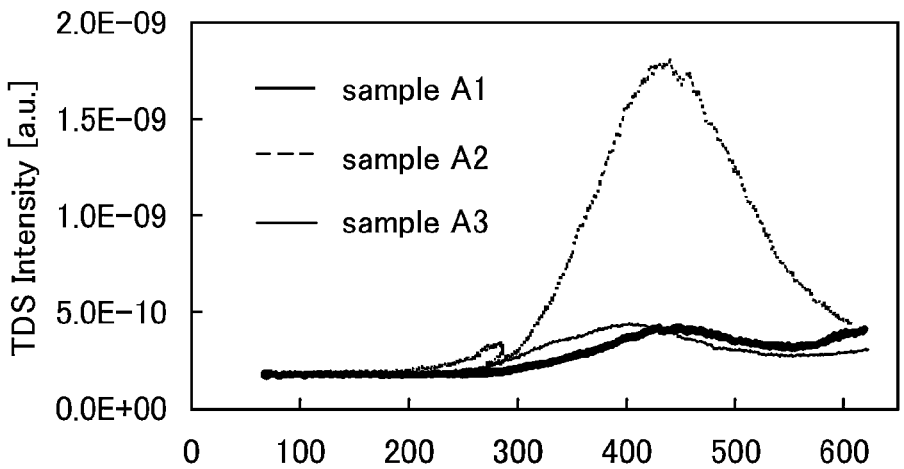
FIGS. 13A to 13C show results of thermal desorption spectroscopy.
Figure 13B:
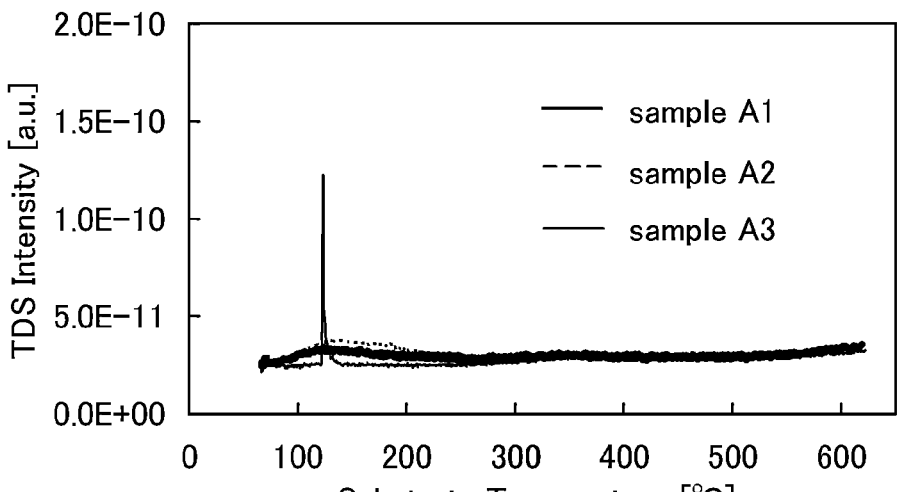
Figure 13C:
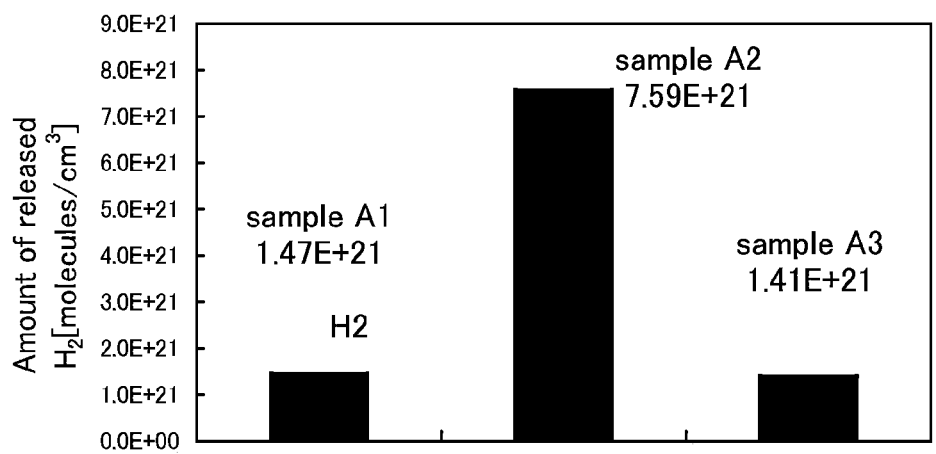
Figure 14A:
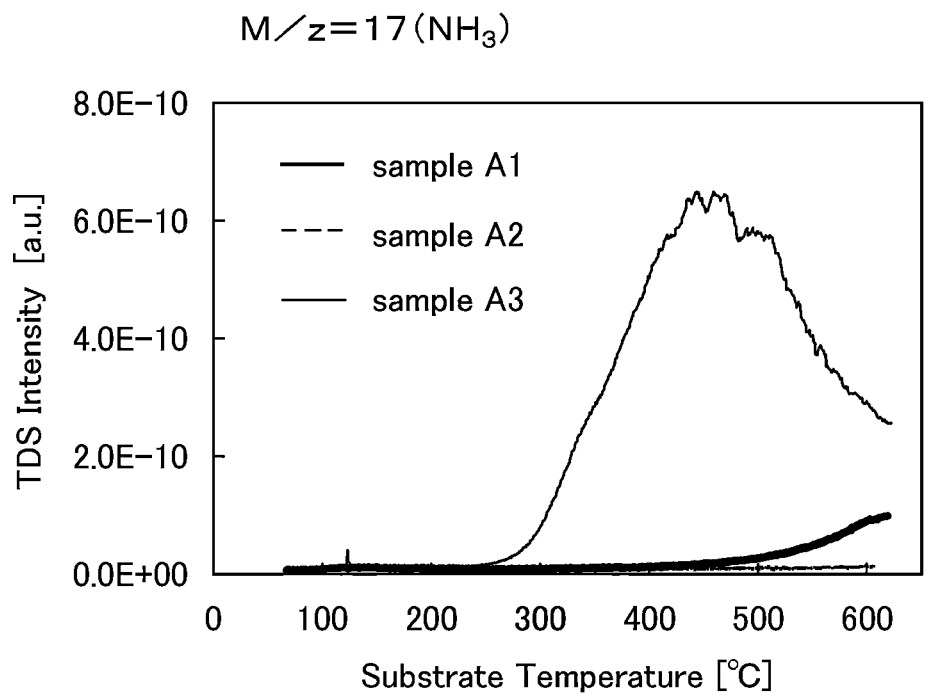
FIGS. 14A and 14B show results of thermal desorption spectroscopy.
Figure 14B:
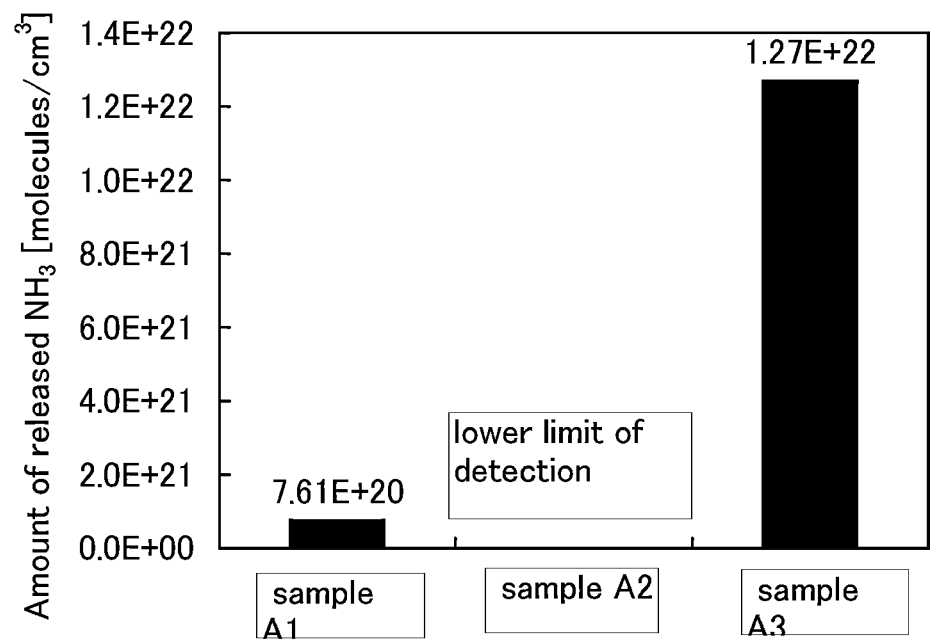

FIGS. 13A to 13C and FIGS. 14A and 14B show the results of the TDS analyses on the samples A1 to A3 having the structure 1. FIG. 13A is a graph of the amount of a released gas which has a M/z of 2, typically hydrogen molecules, against the substrate temperature. FIG. 13B is a graph of the amount of a released gas which has a M/z of 18, typically water molecules, against the substrate temperature. FIG. 13C is a graph of the amount of released hydrogen molecules calculated from an integral value of a peak of a curve in FIG. 13A. FIG. 14A is a graph of the amount of a released gas which has a M/z of 17, typically ammonia molecules, against the substrate temperature. FIG. 14B is a graph of the amount of released ammonia molecules calculated from an integral value of a peak of a curve in FIG. 14A. In these TDS analyses, the lower limit of detection of hydrogen molecules was $1.0 \times 10^{21}$ molecules/cm$^3$, and, the lower limit of detection of ammonia molecules was $2.0 \times 10^{20}$ molecules/cm$^3$.

As shown in FIG. 13A, the TDS intensity of hydrogen molecules of the sample A2 is higher than that of the sample A1 and that of the sample A3. As shown in FIG. 13C, the amount of released hydrogen molecules of the sample A2 against the substrate temperature is approximately five times that of the sample A1 and the sample A3. As shown in FIG. 13B, in the samples A1 to A3, a peak indicating the release of water molecules is seen when the temperature of each substrate was in the range from higher than or equal to 100° C. to lower than or equal to 200° C. Note that only in the sample A3, a sharp peak was detected in the range.

In contrast, as shown in FIG. 14A, the TDS intensity of ammonia molecules of the sample A3 is higher than that of the sample A1 and the sample A2. As shown in FIG. 14B, the amount of released ammonia molecules of the sample A3 against the substrate temperature is at least approximately greater than or equal to 16 times that of the sample A1 and the sample A2. The amount of released ammonia molecules of the sample A2 is less than or equal to the lower limit of detection.

Figure 12B:
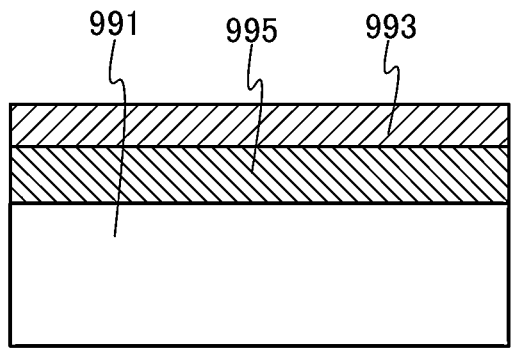

Next, the structure 2 which was employed to some of the formed samples is described. A silicon oxynitride film 995 was formed over the silicon wafer 991 by a plasma CVD method using formation conditions which can be used for the insulating film 24 (see FIGS. 1A to 1C), and the silicon nitride film 993 was formed over the silicon oxynitride film 995 in a manner similar to the structure 1, so that the sample having the structure 2 was formed (see FIG. 12B).

In each of the samples having the structure 2, in order to evaluate an effect of suppressing movement of water in the silicon nitride film 993, the silicon oxynitride film 995 is made to contain oxygen at a higher proportion than a stoichiometric composition. FIGS. 16A and 16B show the results of TDS analyses on samples in each of which only the silicon oxynitride film 995 having a thickness of 400 nm was formed over a silicon wafer. In each of the samples, the silicon wafer 991 was heated at 70° C. or higher and 570° C. or lower. FIG. 16A is a graph of the amount of a released gas which has a M/z of 32, typically oxygen molecules, against the substrate temperature. FIG. 16B is a graph of the amount of a released gas which has a M/z of 18, typically water molecules, against the substrate temperature. The silicon oxynitride film which contains oxygen at a higher proportion than a stoichiometric composition contains not only oxygen (see FIG. 16A) but also water (see FIG. 16B); thus, by evaluating the amount of released water molecules against the substrate temperature of the samples A4 to A6 having the structure 2, whether or not the silicon nitride film 993 has an effect of suppressing movement of water can be evaluated. FIGS. 16A and 16B show the results on samples in each of which the silicon oxynitride film 995 having a thickness of 400 nm was formed over the silicon wafer.

The formation conditions of the silicon oxynitride film 995 was as follows: the temperature of the silicon wafer 991 was 220° C.; the source gas was silane and nitrogen monoxide with a flow rate of 160 sccm and 4000 sccm, respectively; the pressure of the treatment chamber was 200 Pa; and the high-frequency power supplied to parallel plate electrodes was 27.12 MHz and 1500 W (the power density was $2.5 \times 10^{-1}$ W/cm$^2$). The thickness of the silicon oxynitride film 995 was 400 nm.

In the samples having the structure 2, the silicon nitride film 993 was formed using the three conditions, which are the condition 1, the condition 2, and the condition 3. The sample which has the structure 2 and is formed using the condition 1 is referred to as a sample A4. The sample which has the structure 2 and is formed using the condition 2 is referred to as a sample A5. The sample which has the structure 2 and is formed using the condition 3 is referred to as a sample A6. The samples A4 to A6 each has the silicon nitride film 993 with a thickness of 50 nm. The details of the conditions 1 to 3 are the same as those of the structure 1.

TDS analyses were performed on the samples A4 to A6 in order to evaluate an effect of suppressing movement of water. In each of the samples, the silicon wafer 991 was heated at 70° C. or higher and 580° C. or lower.

Figure 15A:
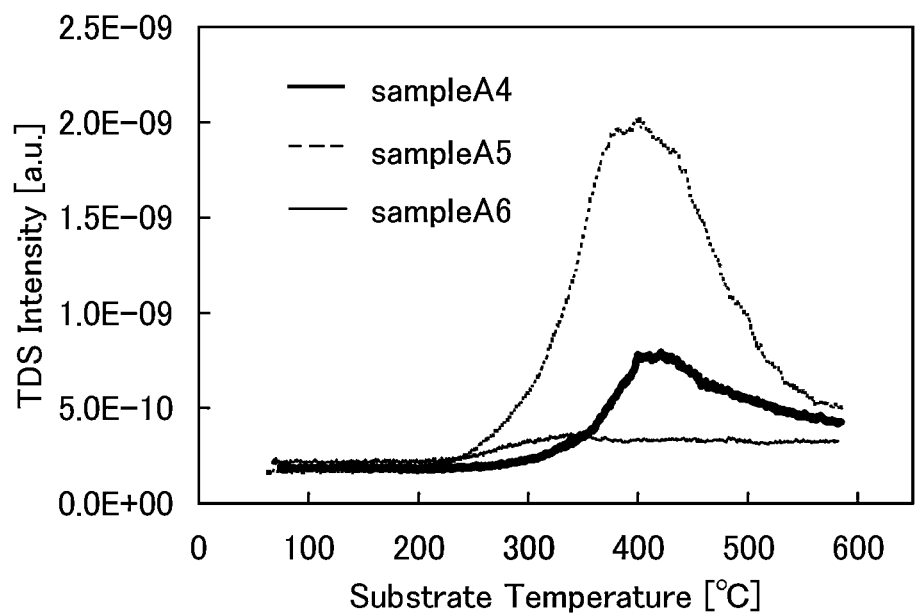
FIGS. 15A and 15B show results of thermal desorption spectroscopy.
Figure 15B:
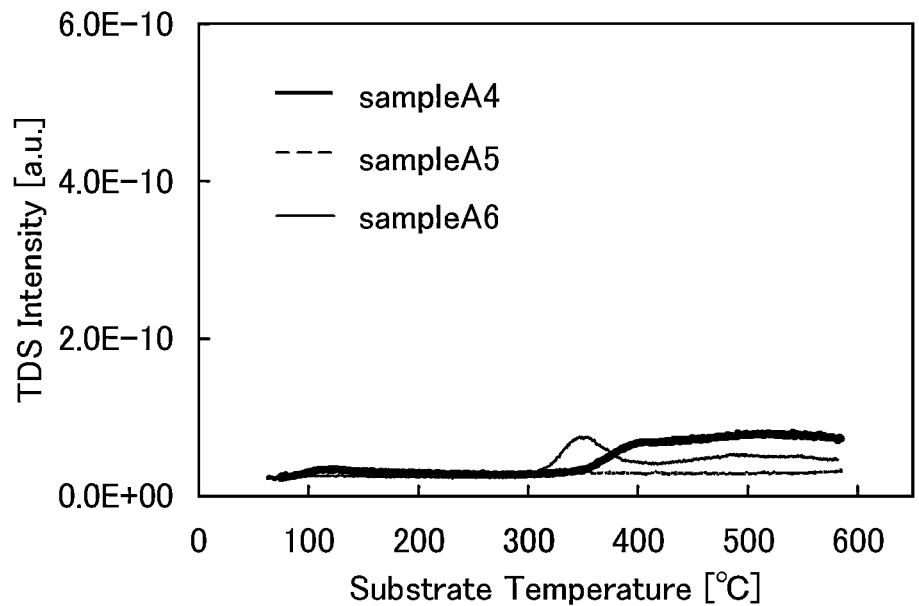

FIGS. 15A and 15B show the results of the TDS analyses on the samples A4 to A6 having the structure 2. FIG. 15A is a graph of the amount of released hydrogen molecules against the substrate temperature. FIG. 15B is a graph of the amount of released water molecules against the substrate temperature.

As shown in FIG. 15A, the TDS intensity of hydrogen molecules of the sample A5 is higher than that of the sample A4 and that of the sample A6. As shown in FIG. 15B, a minor peak is seen in the TDS intensity of water molecules; however, large difference is not seen among the samples A4 to A6.

The samples A4 to A6 having the structure 2 each have a very low intensity of a peak indicating the release of water molecules despite the presence of the silicon oxynitride film 995. Thus, with the formation conditions of the samples A4 to A6, an insulating film which can suppress movement of water in the silicon nitride film 993.

However, the sample A2 having the structure 1 has a large amount of released hydrogen molecules, and the sample A3 having the structure 1 has a large amount of released ammonia molecules. In the transistor using an oxide semiconductor, hydrogen and nitrogen increase conductivity of the oxide semiconductor film to make the transistor normally on. Thus, hydrogen molecules and ammonia molecules which are sources of nitrogen are both impurities which change electrical characteristics. For example, in the sample A3, the amount of released ammonia molecules is large, which means that there are many nitrogen sources, and the use of such an insulating film is highly likely to make a manufactured transistor normally on. The transistor of one embodiment of the present invention includes the insulating film which suppresses entry of nitrogen (the insulating film 25 in FIGS. 1A to 1C); however, a smaller amount of the released ammonia molecules is preferable to make the electrical characteristics of the transistor better. Thus, the silicon nitride film formed using the conditions of the samples A2 and A3 are not suitable for the insulating film 26.

The above shows that the silicon nitride film formed using the condition 1 which is the formation condition of the sample A1 is the most suitable for the insulating film 26.

Thus, with the condition described in this example, the insulating film which has a small number of released hydrogen molecules and suppresses entry of water. With the insulating film, a transistor in which a change in electrical characteristics is suppressed or a transistor whose reliability is improved can be manufactured.

Example 2

In this example, transistors including silicon nitride films formed using the conditions 1 to 3 described in Example 1 are manufactured, and the measurement results of $V_g$-$I_d$ characteristics are described. The transistors manufactured in this example have a structure partly different from the structure of the transistor of one embodiment of the present invention in order to evaluate an effect of the insulating film suppressing entry of water from the outside. Specifically, transistors manufactured in this example have a structure in which the insulating film 25 is not provided in either the transistor 50 or the transistor 70 described in the above embodiments.

A manufacturing process of a transistor included in each of a sample B1, a sample B2, and a sample B3 is described. In this example, the steps are described with reference to FIGS. 17A to 17D.

Figure 17A:
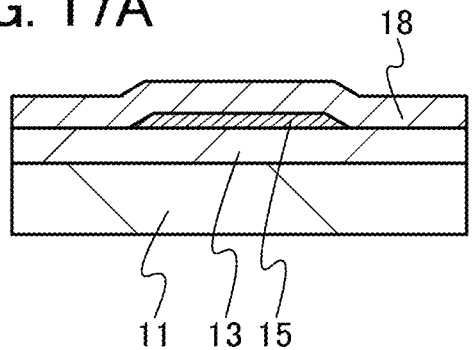
FIGS. 17A to 17D are cross-sectional views illustrating a method for manufacturing a transistor.

First, as illustrated in FIG. 17A, a glass substrate was used as the substrate 11, and the gate electrode 15 was formed over the substrate 11.

A 100 nm-thick tungsten film was formed by a sputtering method, a mask was formed over the tungsten film by a photolithography process, and part of the tungsten film was etched with the use of the mask, so that the gate electrode 15 was formed.

Next, the gate insulating film 18 was formed over the gate electrode 15.

As the gate insulating film 18, a stacked layer including a 50-nm-thick silicon nitride film and a 200-nm-thick silicon oxynitride film were stacked. The silicon nitride film was formed in the following conditions: silane and nitrogen were supplied at 50 sccm and 5000 sccm, respectively, into a treatment chamber of a plasma CVD apparatus; the pressure of the treatment chamber was adjusted to 60 Pa; and power of 150 W was supplied with the use of a 27.12 MHz high-frequency power source. The silicon oxynitride film was formed in the following conditions: silane and dinitrogen monoxide were supplied at 20 sccm and 3000 sccm, respectively, into the treatment chamber of the plasma CVD apparatus; the pressure of the treatment chamber was adjusted to 40 Pa; and power of 100 W was supplied with the use of a 27.12 MHz high-frequency power source. Note that each of the silicon nitride film and the silicon oxynitride film was formed at a substrate temperature of 350° C.

Next, the oxide semiconductor film 19 overlapping with the gate electrode 15 with the gate insulating film 18 provided therebetween was formed.

Here, an IGZO film which was a CAAC-OS film was formed over the gate insulating film 18 by a sputtering method, a mask is formed over the IGZO film by a photolithography process, and the IGZO film was partly etched using the mask. Then, the etched IGZO film was subjected to heat treatment, so that the oxide semiconductor film 19 was formed. Note that the IGZO film formed in this example has a thickness of 35 nm.

The IGZO film was formed in such a manner that a sputtering target where In:Ga:Zn=1:1:1 (atomic ratio) was used, argon and oxygen were supplied as a sputtering gas into a treatment chamber of a sputtering apparatus at a flow rate of 50 sccm for each, the pressure in the treatment chamber was controlled to be 0.6 Pa, and direct-current power of 5 kW was supplied. Note that the IGZO film was formed at a substrate temperature of 170° C.

Next, water, hydrogen, and the like contained in the oxide semiconductor film were released by heat treatment. Here, heat treatment at 450° C. for one hour in a nitrogen atmosphere was performed, and then heat treatment at 450° C. for one hour in an atmosphere of nitrogen and oxygen was performed.

Figure 17B:
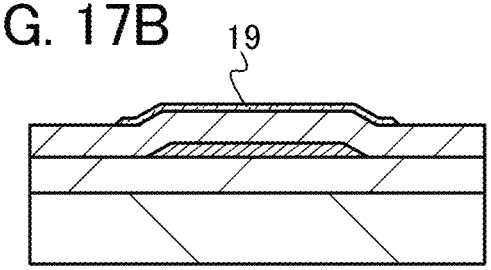

For the structure obtained through the steps up to here, FIG. 17B can be referred to.

Figure 17C:
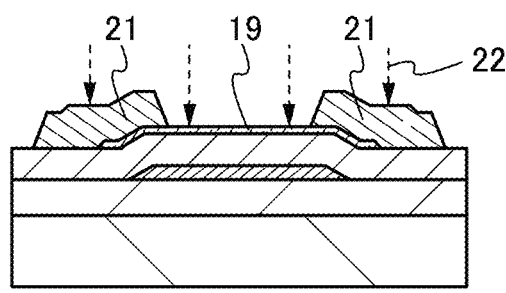

Next, after the gate electrode was exposed by etching a part of the gate insulating film 18 (not illustrated), the pair of electrodes 21 in contact with the oxide semiconductor film 19 was formed as illustrated in FIG. 17C.

A conductive film was formed over the gate insulating film 18 and the oxide semiconductor film 19, a mask was formed over the conductive film by a photolithography process, and the conductive film was partly etched using the mask, so that the pair of electrodes 21 was formed. Note that as the conductive film, a 400-nm-thick aluminum film was formed over a 50-nm-thick tungsten film, and a 100-nm-thick titanium film was formed over the aluminum film.

Next, after the substrate was moved to a treatment chamber under reduced pressure and heated at 220° C., the substrate was moved to a treatment chamber filled with dinitrogen monoxide. Then, the oxide semiconductor film 19 was exposed to oxygen plasma which was generated in such a manner that an upper electrode provided in the treatment chamber was supplied with high-frequency power of 150 W with the use of a 27.12 MHz high-frequency power source, so that the oxygen 22 was supplied.

Next, the insulating films 23 and 24 were formed in succession over the oxide semiconductor film 19 and the pair of electrodes 21 without exposure to the atmosphere after the above plasma treatment. A 50-nm-thick first silicon oxynitride film was formed as the insulating film 23, and a 400-nm-thick second silicon oxynitride film was formed as the insulating film 24.

The first silicon oxynitride film was formed by a plasma CVD method under the following conditions: silane with a flow rate of 30 sccm and dinitrogen monoxide with a flow rate of 4000 sccm were used as a source gas, the pressure in a treatment chamber was 40 Pa, the substrate temperature was 220° C., and high-frequency power of 150 W was supplied to parallel plate electrodes.

The second silicon oxynitride film was formed by a plasma CVD method under the following conditions: silane with a flow rate of 160 sccm and dinitrogen monoxide with a flow rate of 4000 sccm were used as a source gas, the pressure in the treatment chamber was 200 Pa, the substrate temperature was 220° C., and high-frequency power of 1500 W was supplied to the parallel plate electrodes. Under the above conditions, it is possible to form a silicon oxynitride film which contains oxygen at a higher proportion than the stoichiometric composition and from which part of oxygen is released by heating.

Next, water, hydrogen, and the like were released from the insulating films 23 and 24 by heat treatment. Here, the heat treatment was performed in an atmosphere of nitrogen and oxygen at 350° C. for one hour.

Figure 17D:
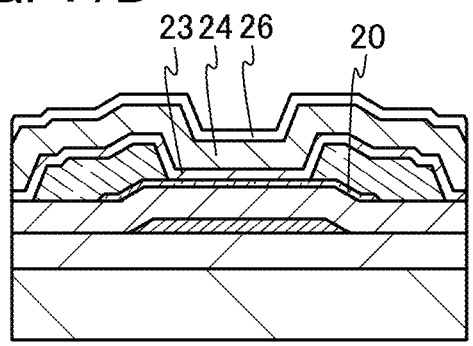

Next, as illustrated in FIG. 17D, the insulating film 26 was formed over the insulating film 24.

In the sample B1, as the insulating film 26, the silicon nitride film was formed under the condition 1 of the sample A1 described in Example 1.

In the sample B2, as the insulating film 26, the silicon nitride film was formed under the condition 2 of the sample A2 described in Example 1.

In the sample B3, as the insulating film 26, the silicon nitride film was formed under the condition 3 of the sample A3 described in Example 1.

Next, although not illustrated, parts of the insulating films 23, 24, and 26 were etched, and openings which expose a part of the pair of electrodes were formed.

Next, a planarization film (not illustrated) was formed over the insulating film 26. Here, the insulating film 26 was coated with a composition, and exposure and development were performed, so that a planarization film having an opening through which the pair of electrodes is partly exposed was formed. Note that as the planarization film, a 1.5-μm-thick acrylic resin was formed. Then, heat treatment was performed. The heat treatment was performed at a temperature of 250° C. in a nitrogen atmosphere for one hour.

Next, a conductive film connected to part of the pair of electrodes is formed (not illustrated). Here, a 100-nm-thick ITO film containing silicon oxide was formed by a sputtering method.

Through these steps, transistors in the samples B1 to B3 were manufactured. Further, in each of the samples, 24 transistors having the same structure were manufactured on the substrate.

Next, Vg-Id characteristics of the transistors in the samples B1 to B3 were measured.

Next, a pressure cooker test (PCT) was performed as the accelerated life test to evaluate moisture resistance. In the PCT in this example, the samples B1 to B3 were held for 15 hours under the following conditions: the temperature was 130° C., the humidity was 85%, and the pressure was 0.23 MPa.

Figure 18A:
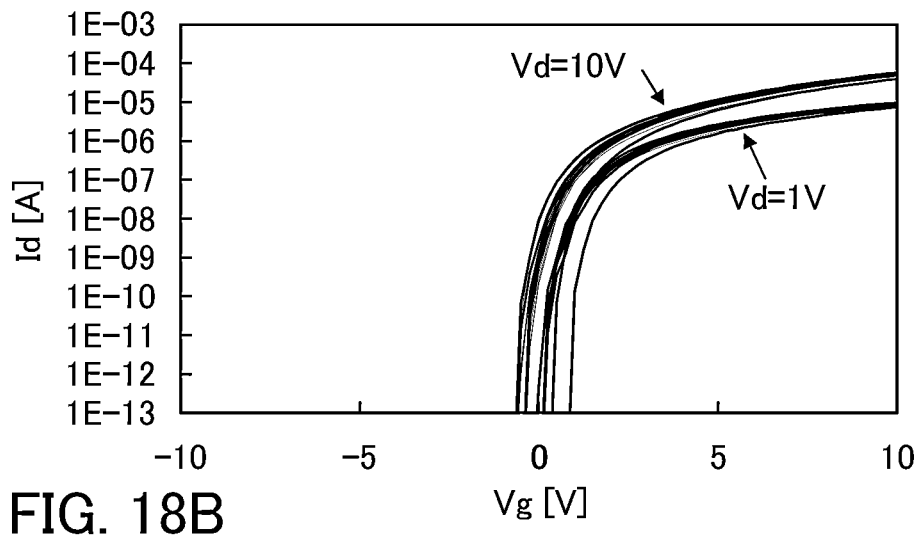
FIGS. 18A to 18C each show $V_g$-$I_d$ characteristics of a transistor.
Figure 18B:
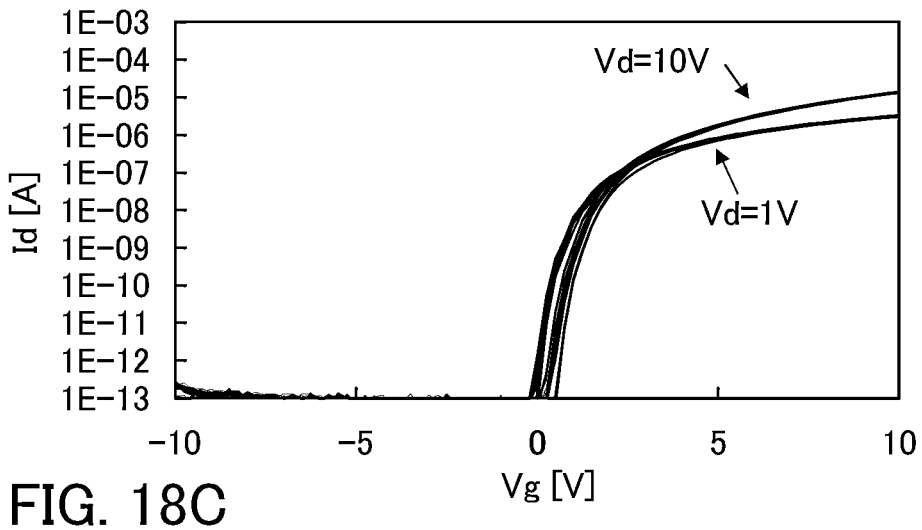
Figure 18C:
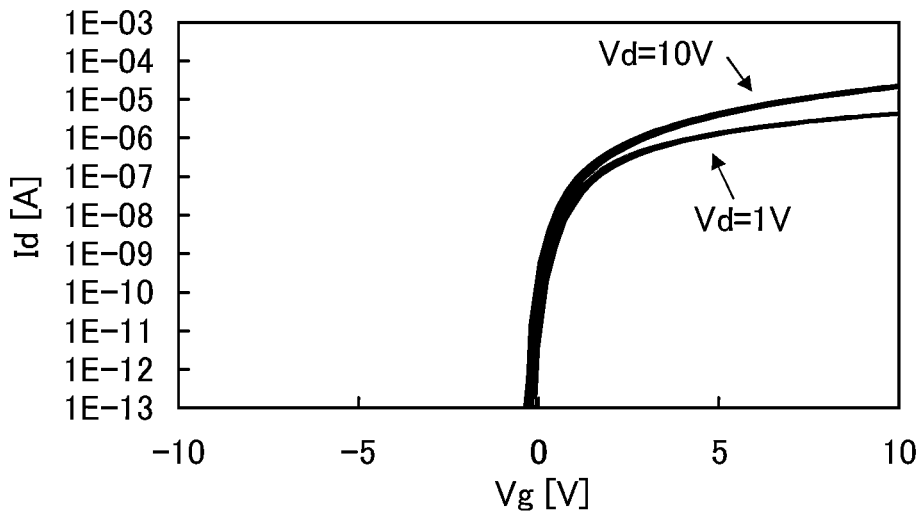
Figure 19A:
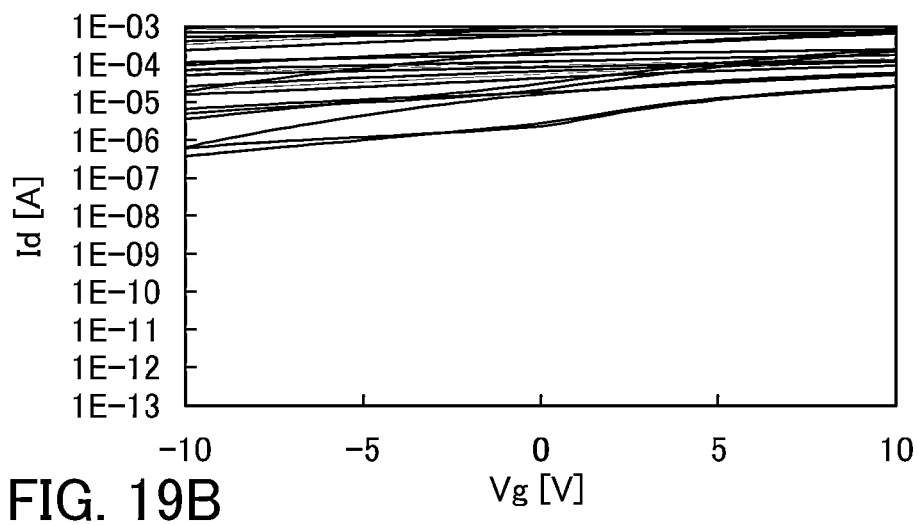
FIGS. 19A to 19C each show $V_g$-$I_d$ characteristics of a transistor.
Figure 19B:
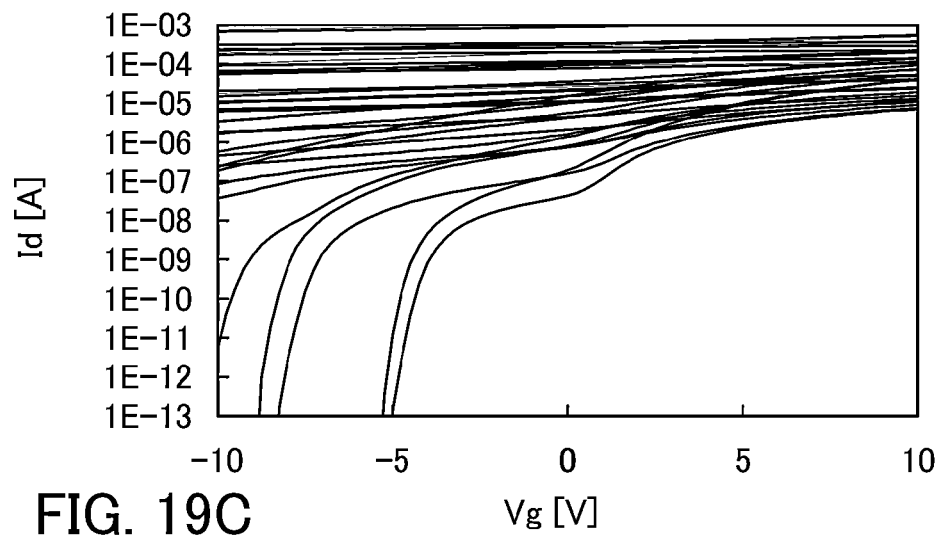
Figure 19C:
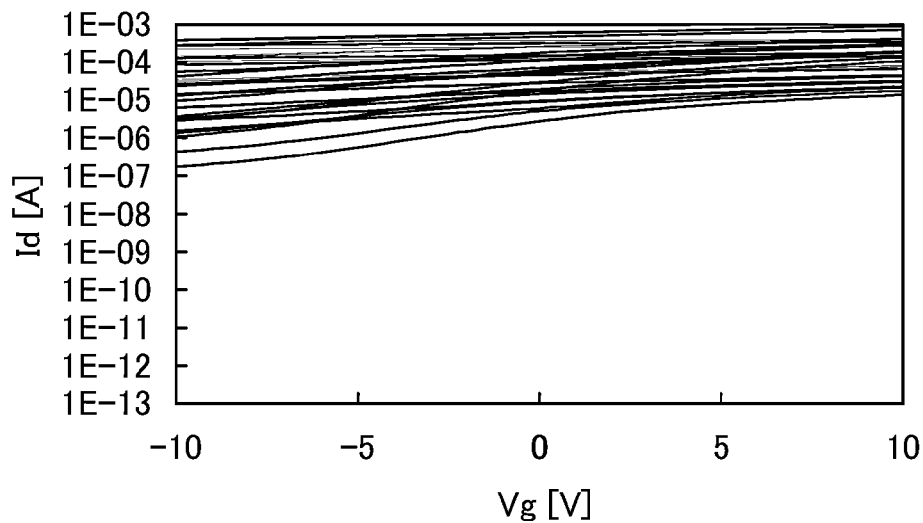
Figure 20A:
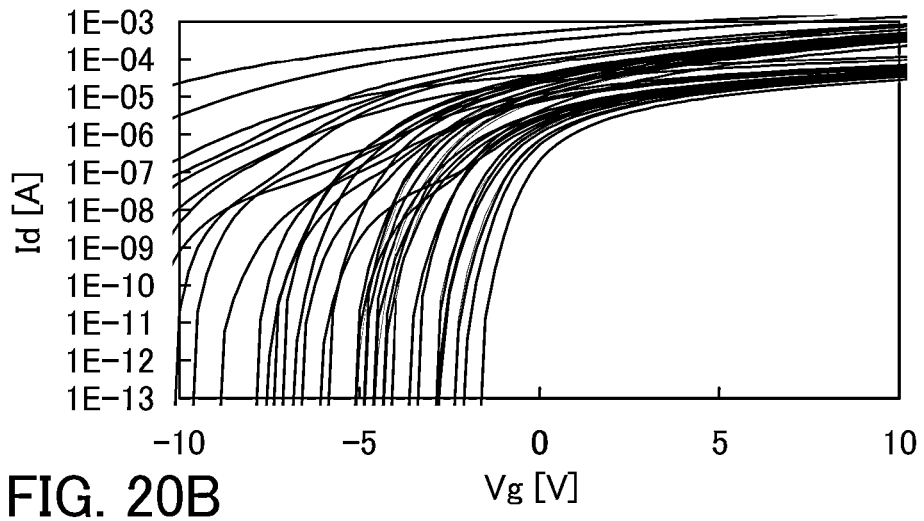
FIGS. 20A to 20C each show $V_g$-$I_d$ characteristics of a transistor.
Figure 20B:
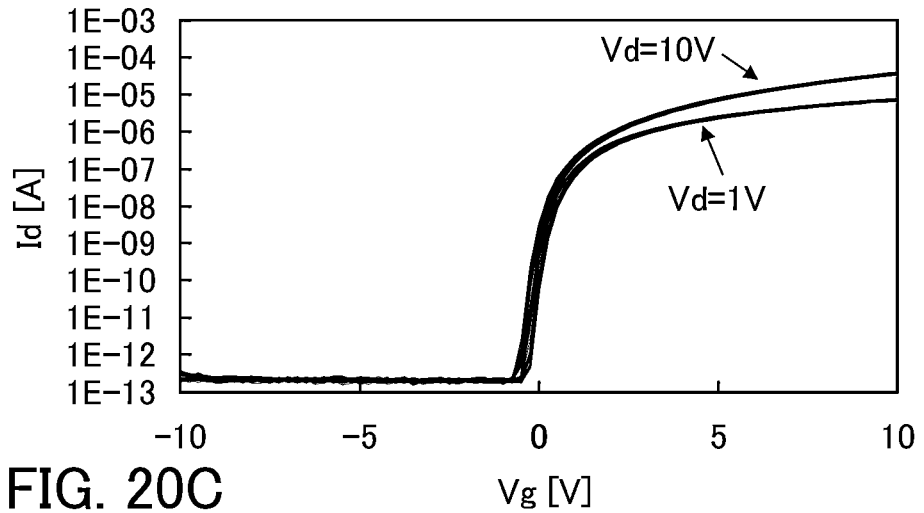
Figure 20C:
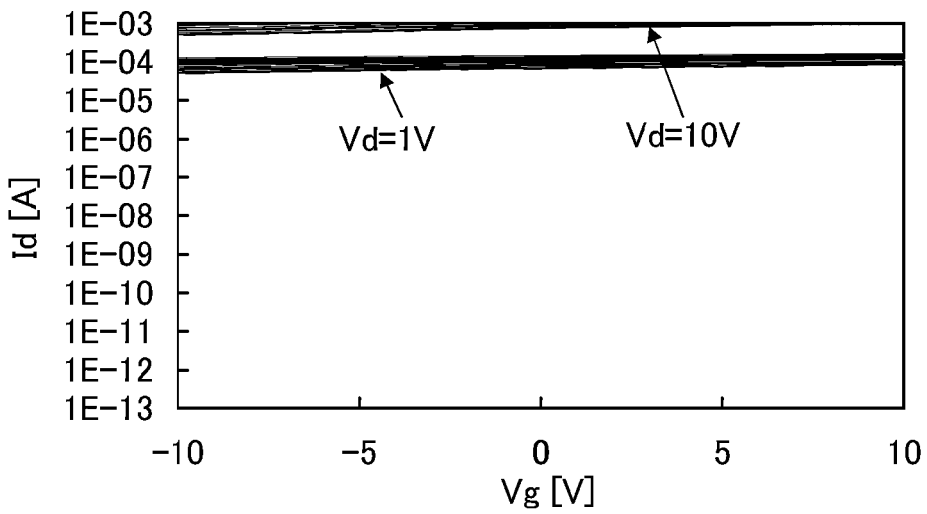

FIGS. 18A to 18C, FIGS. 19A to 19C, and FIGS. 20A to 20C show Vg-Id initial characteristics of the transistors of the samples B1 to B3 and Vg-Id characteristics of the transistors after the pressure cooker test. That is, the results of the sample B1 are shown in FIGS. 18A to 18C, the results of the sample B2 are shown in FIGS. 19A to 19C, and the results of the sample B3 are shown in FIGS. 20A to 20C.

Note that in each of the samples, Vg-Id characteristics of a transistor 1 whose channel length (L) is 2 μm and channel width (W) is 50 μm and a transistor 2 whose channel length (L) is 6 μm and channel width (W) is 50 μm were measured. The initial characteristics of the transistors 1 of the samples B1 to B3 are shown in FIG. 18A, FIG. 19A, and FIG. 20A, the initial characteristics of the transistors 2 of the samples B1 to B3 are shown in FIG. 18B, FIG. 19B, and FIG. 20B, and the Vg-Id characteristics of the transistors 2 of the samples B1 to B3 after the pressure cooker test are shown in FIG. 18C, FIG. 19C, and FIG. 20C.

According to the Vg-Id characteristics shown in FIG. 19A, the transistors do not have switching characteristics. Further, according to the Vg-Id characteristics shown in FIG. 20A, variation in threshold voltage of the transistors is large. However, according to the Vg-Id characteristics shown in FIG. 18A, it is found that the transistors has favorable switching characteristics and variation in threshold voltage of the transistors is small.

It is found that variation in threshold voltage of the transistor in the initial characteristics of the Vg-Id characteristics shown in FIG. 18B and FIG. 20B is smaller than that in the initial characteristics of the Vg-Id characteristics shown in FIG. 19B.

The Vg-Id characteristics shown in FIG. 18C have more favorable switching characteristics than the Vg-Id characteristics after the pressure cooker test shown in FIG. 19C and FIG. 20C.

For the above reasons, a nitride insulating film is formed over a transistor, and the amounts of released hydrogen molecules and released ammonia molecules are small, whereby a shift of threshold voltage in the negative direction can be reduced and the reliability of the transistor can be improved.

Next, a plurality of samples was manufactured by forming the insulating film 26 through a similar process to the samples B1 to B3 in this example and under a condition other than the conditions 1 to 3. In each of the samples, 24 transistors having the same structure were formed on the substrate, and the Vg-Id initial characteristics of the transistors were compared to one another. Note that in each of the transistors, the channel length (L) is 2 μm and the channel width (W) is 50 μm.

Figure 21:
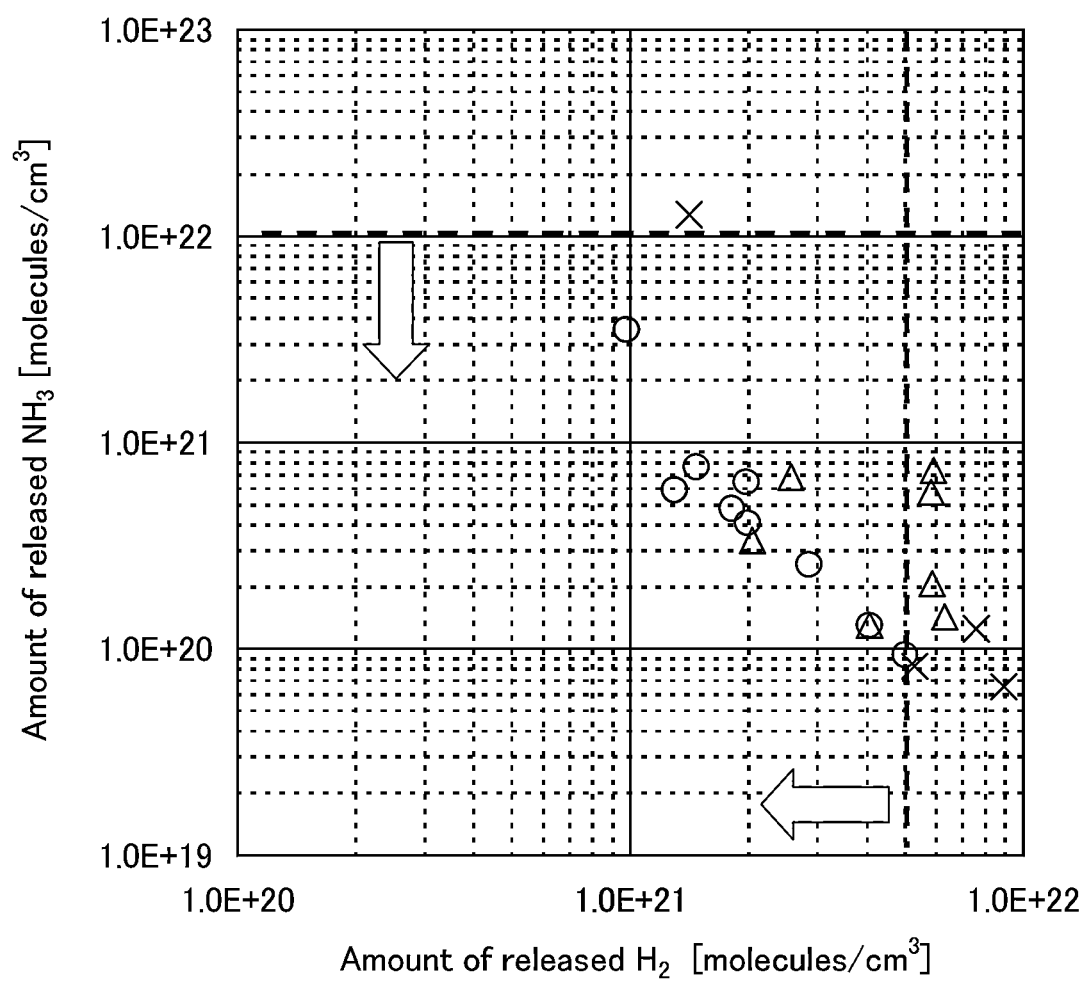
FIG. 21 shows a relation between $V_g$-$I_d$ characteristics of a transistor and the amount of released hydrogen molecules and the amount of released ammonia molecules in a silicon nitride film.

FIG. 21 shows a relation between the amounts of released hydrogen molecules and released ammonia molecules from the insulating film 26 and the Vg-Id initial characteristics of the transistors in the plurality of samples in which the insulating film 26 is formed under a condition of the samples B1 to B3 or a condition other than the conditions 1 to 3.

In FIG. 21, the horizontal axis indicates the number of hydrogen molecules released from the insulating film 26 and the vertical axis indicates the amount of ammonia molecules released from the insulating film 26. Further, in FIG. 21, circles indicate that the difference between the maximum threshold voltage and the minimum threshold voltage (Vth_max−Vth_min) in the 24 transistors on the substrate is less than or equal to 1 V. Further, triangles indicate that Vth_max−Vth_min is greater than 1 V and less than or equal to 3 V. Further, crosses indicate that Vth_max−Vth_min is greater than 3 V.

In FIG. 21, in a region where the amount of hydrogen molecules released from the insulating film 26 is smaller than $5.0 \times 10^{21}$ molecules/cm$^3$, a change in threshold voltage of the transistor is reduced. Thus, it can be said that a nitride insulating film is provided over a transistor, and the amount of hydrogen molecules released from the nitride insulating film is smaller than $5.0 \times 10^{21}$ molecules/cm$^3$, whereby a change in threshold voltage of the transistor can be reduced. Moreover, it can be said that a shift of the threshold voltage in the negative direction can be suppressed.

By providing the insulating film which suppresses entry of nitrogen (the insulating film 25) between the insulating film 26 and the oxide semiconductor film 20 in a manner similar to that of the transistor of one embodiment of the present invention, a change in threshold voltage of the transistor can be suppressed even in the case where the formation conditions of the insulating film 26 are the conditions indicated by crosses or triangles in FIG. 21.

REFERENCE NUMERALS

11: substrate, 13: base insulating film, 15: gate electrode, 18: gate insulating film, 19: oxide semiconductor film, 20:

oxide semiconductor film, 21: electrode, 22: oxygen, 23: insulating film, 24: insulating film, 25: insulating film, 26: insulating film, 27: protective film, 50: transistor, 61: gate electrode, 70: transistor, 491: common potential line, 492: common electrode, 601: substrate, 602: photodiode, 606a: semiconductor film, 606b: semiconductor film, 606c: semiconductor film, 608: adhesive layer, 613: substrate, 632: insulating film, 633: interlayer insulating film, 634: interlayer insulating film, 640: transistor, 641a: electrode, 641b: electrode, 642: electrode, 643: conductive film, 645: conductive film, 656: transistor, 658: photodiode reset signal line, 659: gate signal line, 671: photosensor output signal line, 672: photosensor reference signal line, 901: substrate, 902: pixel portion, 903: signal line driver circuit, 904: scan line driver circuit, 905: sealant, 906: substrate, 908: liquid crystal, 910: transistor, 911: transistor, 913: liquid crystal element, 915: connection terminal electrode, 916: terminal electrode, 918: FPC, 918a: FPC, 918b: FPC, 919: anisotropic conductive film, 923: insulating film, 924: insulating film, 926: spacer, 929: electrode, 930: electrode, 931: counter electrode, 932: insulating film, 934: pixel electrode, 935: alignment film, 936: alignment film, 937: sealant, 938: insulating film, 939: insulating film, 940: planarization insulating film, 942: insulating film, 943: insulating film, 960: partition, 961: light-emitting layer, 963: light-emitting element, 964: filler, 991: silicon wafer, 993: silicon nitride film, 995: silicon oxynitride film, 9000: table, 9001: housing, 9002: leg portion, 9003: display portion, 9004: displayed button, 9005: power cord, 9033: clip, 9034: switching button, 9035: power-saving-mode switching button, 9036: switch, 9038: operation button, 9100: television set, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631a: display portion, 9631b: display portion, 9632a: touch panel region, 9632b: touch panel region, 9633: solar battery, 9634: charge and discharge control circuit, 9635: battery, 9636: DCDC converter, 9637: converter, 9638: operation key, 9639: button This application is based on Japanese Patent Application serial No. 2012-147783 filed with Japan Patent Office on Jun. 29, 2012, the entire contents of which are hereby incorporated by reference.

The invention claimed is:
1. A semiconductor device comprising:
a gate electrode;
a gate insulating film covering the gate electrode;
an oxide semiconductor film overlapping with the gate electrode with the gate insulating film interposed therebetween;
a pair of electrodes over and in contact with the oxide semiconductor film;
a first insulating film over the oxide semiconductor film and the pair of electrodes; and
a second insulating film which is over and in contact with the first insulating film and contains at least nitrogen,
wherein the first insulating film is configured to protect the oxide semiconductor film from nitrogen which is released from the second insulating film and enters the oxide semiconductor film,
wherein the amount of hydrogen molecules released by heating from the second insulating film is smaller than $5.0 \times 10^{21}$ molecules/cm$^3$, and
wherein the first insulating film is an oxide insulating film of which an etching rate with hydrofluoric acid of 0.5 wt % at 25° C. is lower than or equal to 10 nm/min.

2. The semiconductor device according to claim 1,
wherein the first insulating film is a dense oxide insulating film.

3. The semiconductor device according to claim 1, further comprising an organic resin film provided in contact with the second insulating film.

4. The semiconductor device according to claim 3,
wherein the organic resin film is an acrylic film.

5. A semiconductor device comprising:
a gate electrode;
a gate insulating film covering the gate electrode;
an oxide semiconductor film overlapping with the gate electrode with the gate insulating film interposed therebetween;
a pair of electrodes in contact with the oxide semiconductor film;
a first insulating film over and in contact with the oxide semiconductor film;
a second insulating film over and in contact with the first insulating film;
a third insulating film over and in contact with the second insulating film; and
a fourth insulating film which is over and in contact with the third insulating film and contains at least nitrogen,
wherein the first insulating film is an insulating film through which oxygen penetrates,
wherein the second insulating film contains oxygen at a higher proportion than a stoichiometric composition,
wherein the third insulating film is configured to protect the oxide semiconductor film from nitrogen which is released from the fourth insulating film and enters the oxide semiconductor film, and
wherein the amount of hydrogen molecules released by heating from the fourth insulating film is smaller than $5.0 \times 10^{21}$ molecules/cm$^3$.

6. The semiconductor device according to claim 5,
wherein the third insulating film is a dense oxide insulating film.

7. The semiconductor device according to claim 5,
wherein the third insulating film is an oxide insulating film of which an etching rate with hydrofluoric acid of 0.5 wt % at 25° C. is lower than or equal to 10 nm/min, which is lower than an etching rate of the second insulating film.

8. The semiconductor device according to claim 5, further comprising an organic resin film provided in contact with the fourth insulating film.

9. The semiconductor device according to claim 8,
wherein the organic resin film is an acrylic film.

10. A semiconductor device comprising:
a gate electrode;
a gate insulating film covering the gate electrode;
an oxide semiconductor film overlapping with the gate electrode with the gate insulating film interposed therebetween;
a pair of electrodes over and in contact with the oxide semiconductor film;
a first insulating film over and in contact with the oxide semiconductor film, the first insulating film comprising oxygen and silicon;
a second insulating film over and in contact with the first insulating film, the second insulating film comprising oxygen and silicon;

a third insulating film over and in contact with the second insulating film, the third insulating film comprising oxygen and silicon; and a fourth insulating film over and in contact with the third insulating film, the fourth insulating film comprising nitrogen and silicon, wherein the first insulating film is an insulating film through which oxygen penetrates, wherein the second insulating film contains the oxygen at a higher proportion than a stoichiometric composition, and wherein the amount of hydrogen molecules released by heating from the fourth insulating film is smaller than $5.0 \times 10^{21}$ molecules/cm$^3$.

11. The semiconductor device according to claim 10, wherein the third insulating film is a dense oxide insulating film.

12. The semiconductor device according to claim 10, wherein the third insulating film is an oxide insulating film of which an etching rate with hydrofluoric acid of 0.5 wt % at 25° C. is lower than or equal to 10 nm/min, which is lower than an etching rate of the second insulating film.

13. The semiconductor device according to claim 10, further comprising an organic resin film provided in contact with the fourth insulating film.

14. The semiconductor device according to claim 13, wherein the organic resin film is an acrylic film.

15. The semiconductor device according to claim 10, wherein at least one of the first, second, and third insulating films further comprises nitrogen.

* * * * *